(12) United States Patent
Taguchi

(10) Patent No.: US 7,724,563 B2
(45) Date of Patent: May 25, 2010

(54) MEMORY CELL ARRAY WITH LOW RESISTANCE COMMON SOURCE AND HIGH CURRENT DRIVABILITY

(75) Inventor: Masao Taguchi, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 79 days.

(21) Appl. No.: 11/983,864

(22) Filed: Nov. 13, 2007

(65) Prior Publication Data
US 2008/0298115 A1 Dec. 4, 2008

Related U.S. Application Data

(62) Division of application No. 11/412,574, filed on Apr. 27, 2006.

(51) Int. Cl.
*G11C 11/00* (2006.01)
(52) U.S. Cl. ...................................... 365/148; 365/175
(58) Field of Classification Search .................. 365/148, 365/175
See application file for complete search history.

(56) References Cited

U.S. PATENT DOCUMENTS

| | | | |
|---|---|---|---|
| 4,126,900 A | 11/1978 | Koomen et al. | 365/185.01 |
| 5,838,615 A | 11/1998 | Kamiya et al. | 365/185.12 |
| 5,945,717 A | 8/1999 | Chevallier | 257/390 |
| 6,674,132 B2 | 1/2004 | Willer | 257/390 |
| 2003/0011023 A1 | 1/2003 | Hurley | 257/315 |
| 2004/0184331 A1 | 9/2004 | Hanzawa et al. | 365/203 |
| 2005/0023600 A1 | 2/2005 | Shin et al. | 257/315 |
| 2006/0186483 A1* | 8/2006 | Cho et al. | 257/390 |
| 2006/0209585 A1 | 9/2006 | Tanizaki et al. | 365/148 |
| 2006/0209616 A1* | 9/2006 | Kim et al. | 365/230.06 |
| 2006/0220071 A1* | 10/2006 | Kang et al. | 257/248 |
| 2006/0256612 A1* | 11/2006 | Cho et al. | 365/163 |
| 2007/0103972 A1* | 5/2007 | Ro et al. | 365/163 |
| 2007/0133268 A1* | 6/2007 | Choi et al. | 365/163 |

FOREIGN PATENT DOCUMENTS

| | | |
|---|---|---|
| EP | 1463061 | 9/2004 |
| EP | 1755165 | 2/2007 |
| JP | 06291288 | 10/1994 |
| WO | WO 2005/117118 | 12/2005 |

* cited by examiner

*Primary Examiner*—Hoai V Ho

(57) ABSTRACT

In the present resistive memory array, included are a substrate, a plurality of source regions in the substrate, and a conductor connecting the plurality of source regions, the conductor being positioned adjacent to the substrate to form, with the plurality of source regions, a common source. In one embodiment, the conductor is an elongated metal body of T-shaped cross-section. In another embodiment, the conductor is a plate-like metal body.

5 Claims, 29 Drawing Sheets

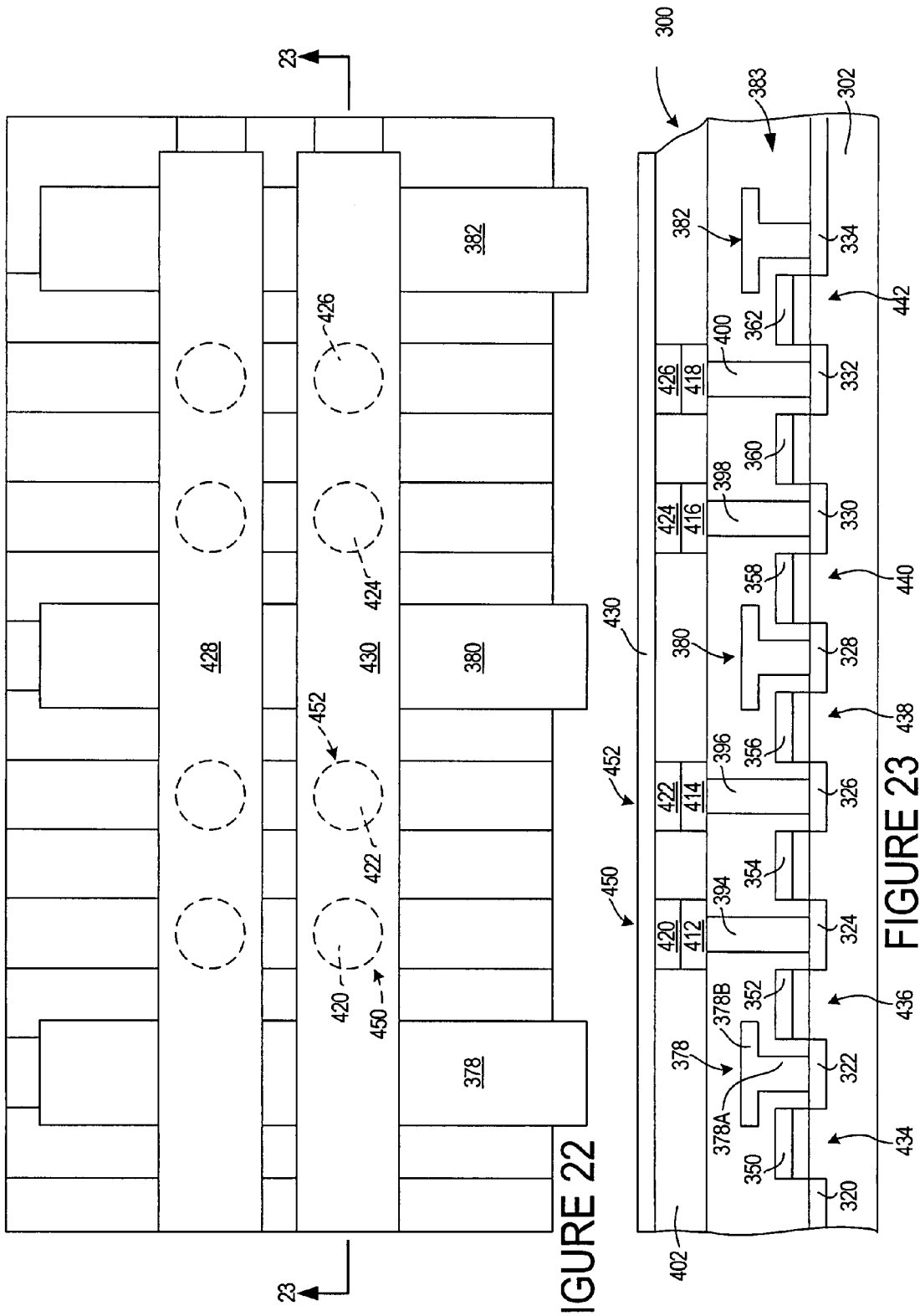

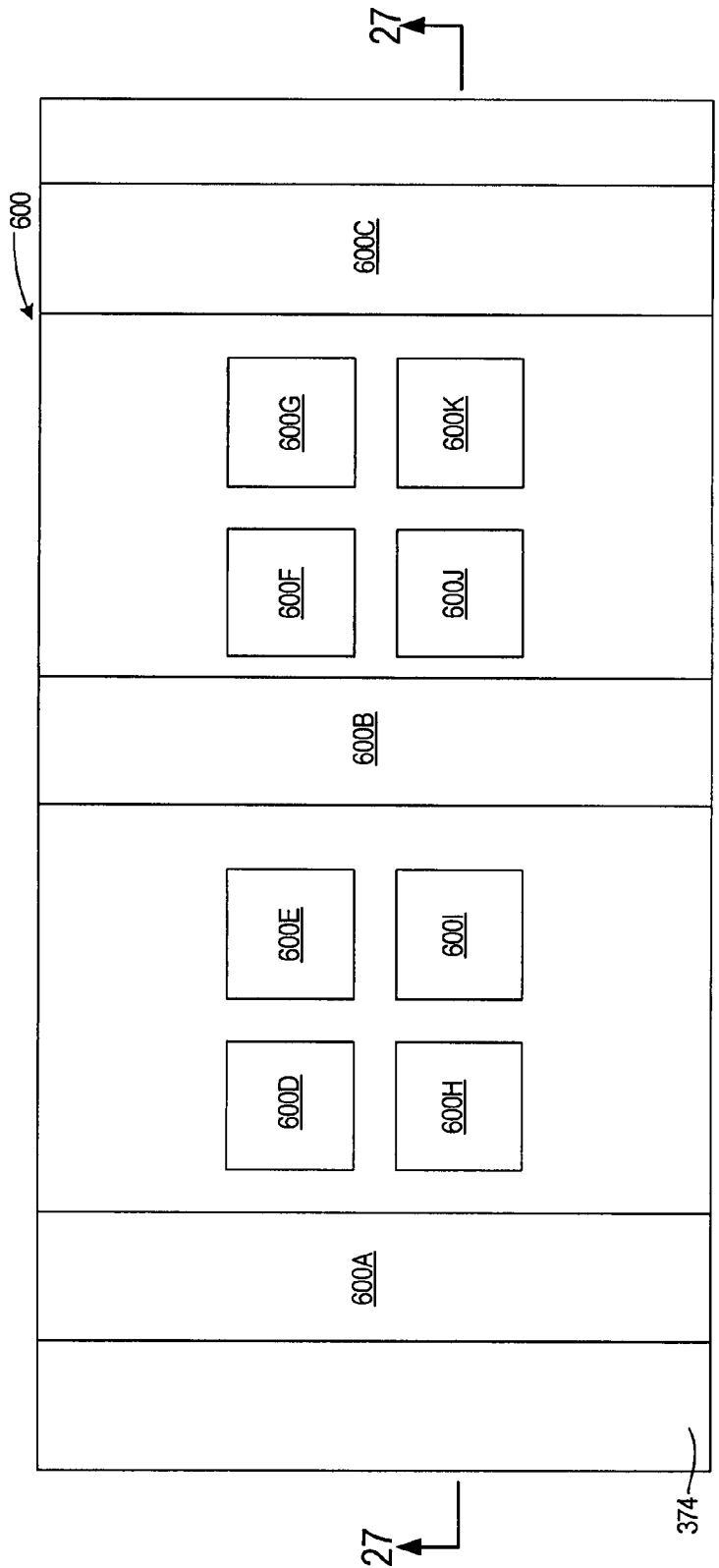
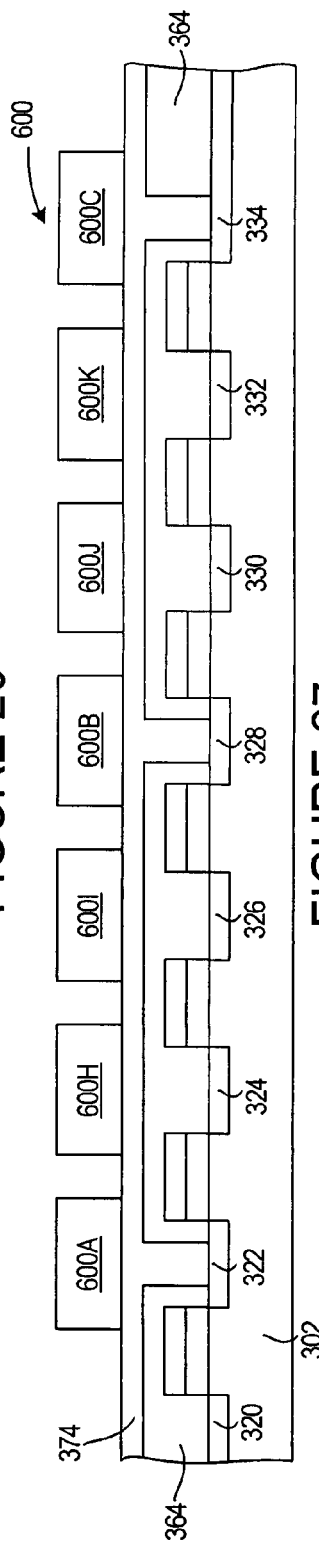
FIGURE 26
FIGURE 27

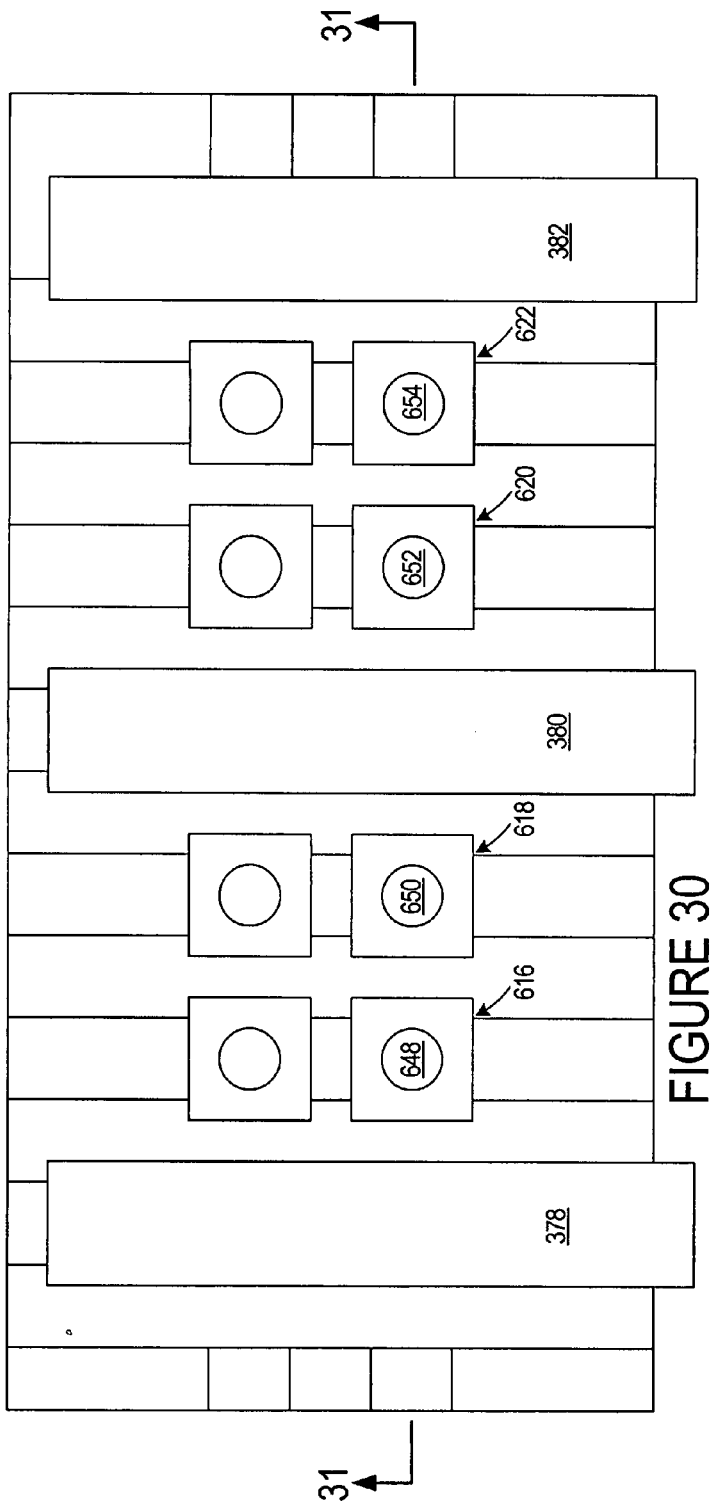
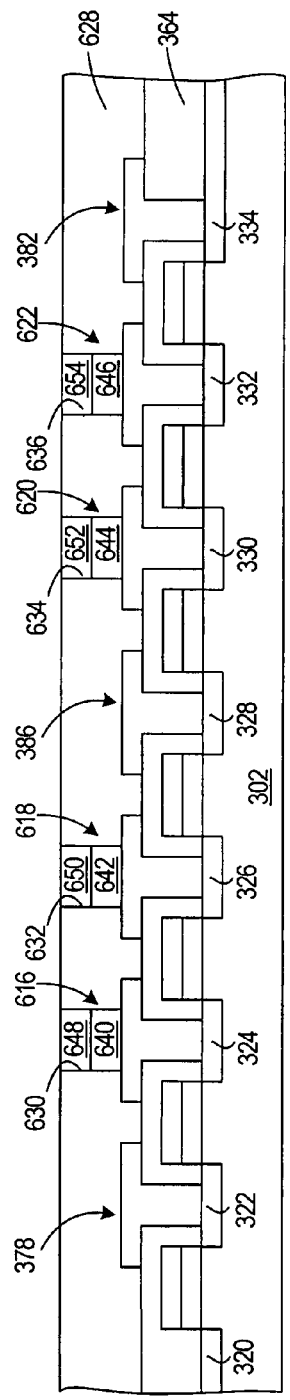
FIGURE 30
FIGURE 31

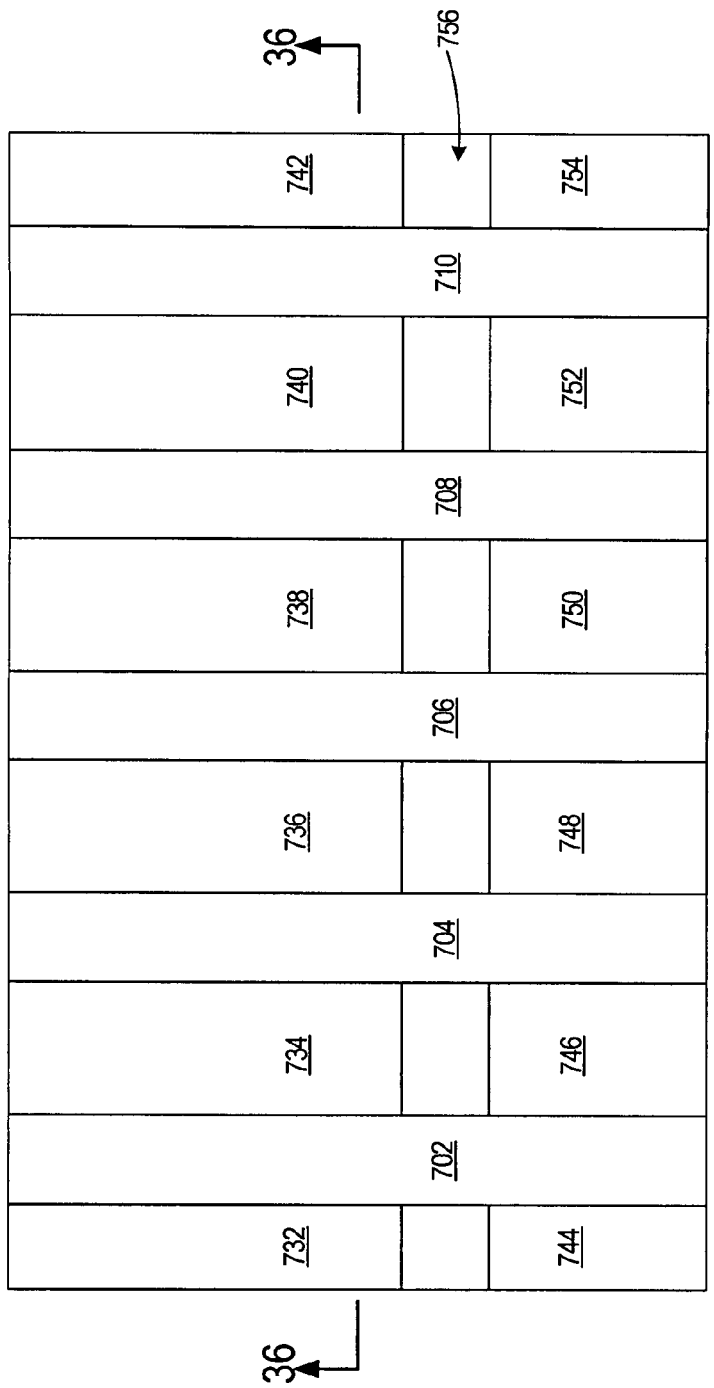
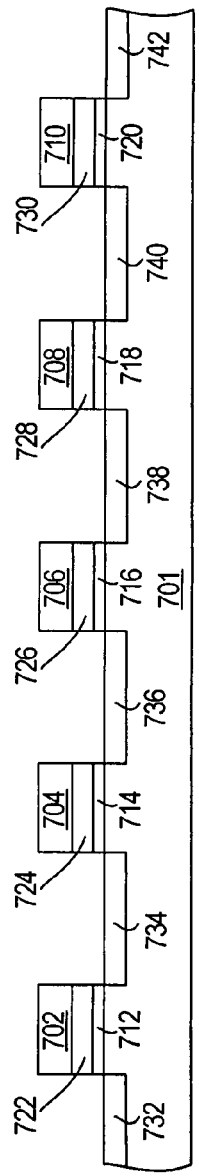
FIGURE 35
FIGURE 36

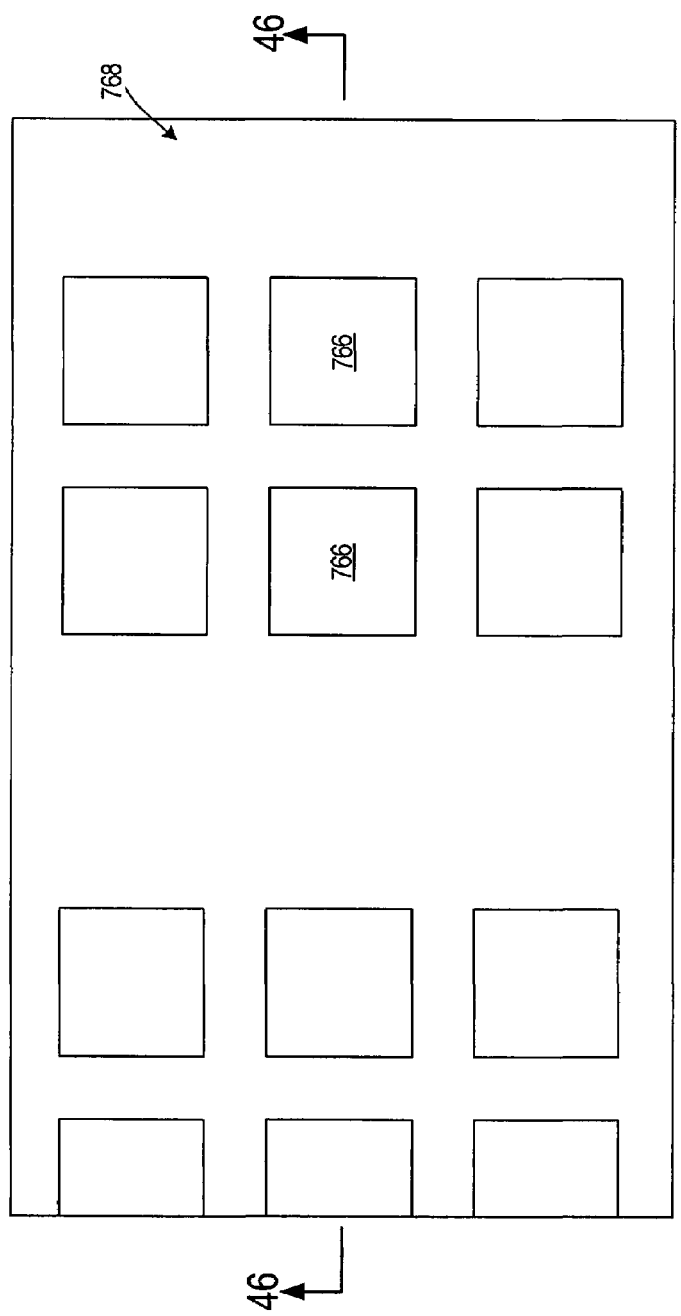
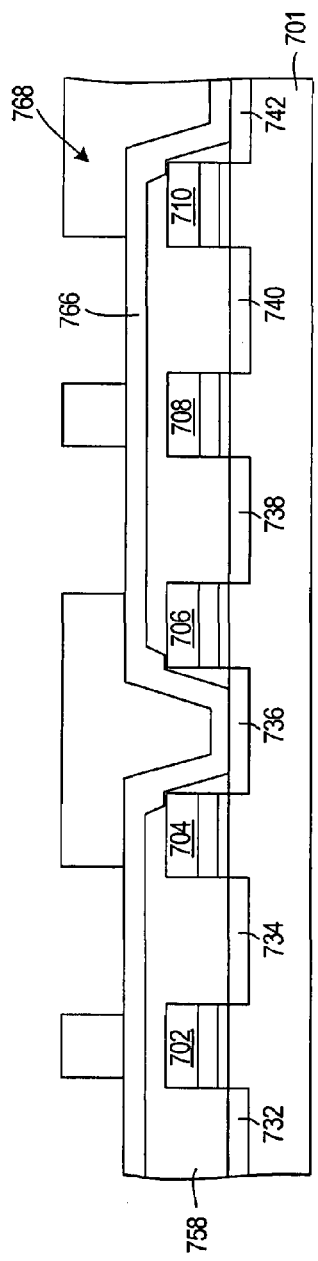
FIGURE 45
FIGURE 46

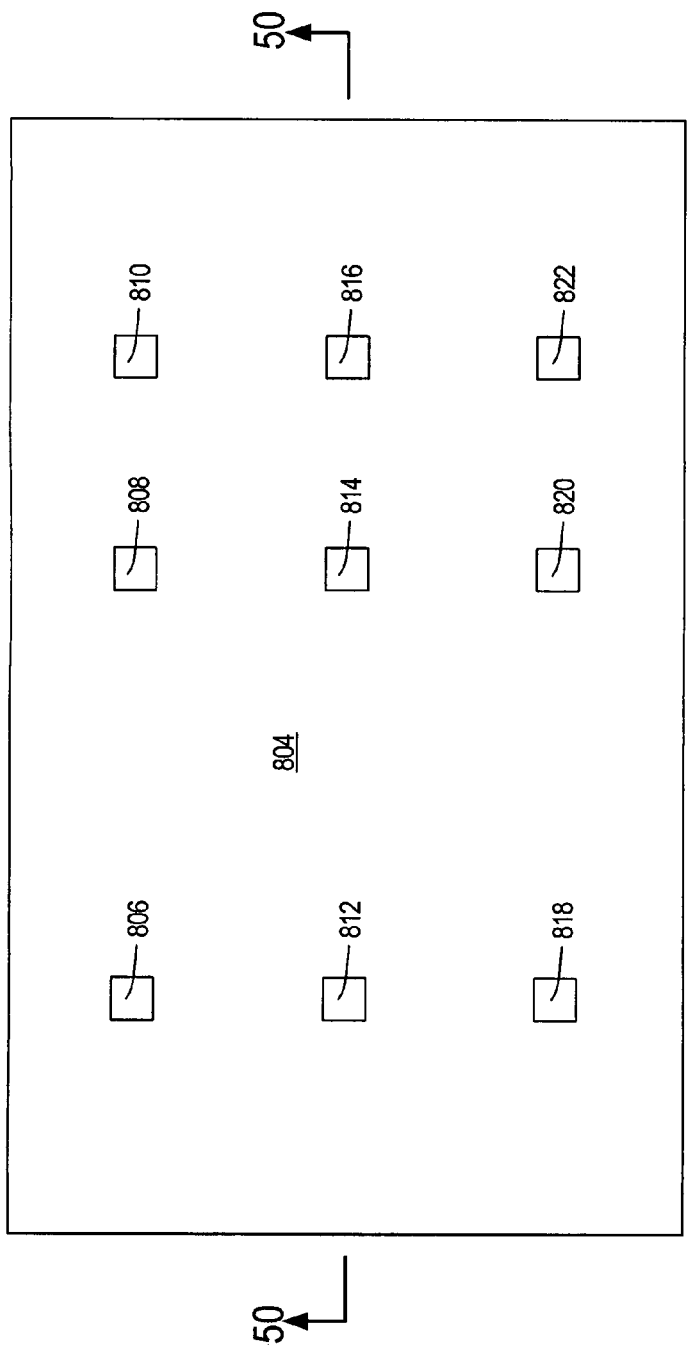
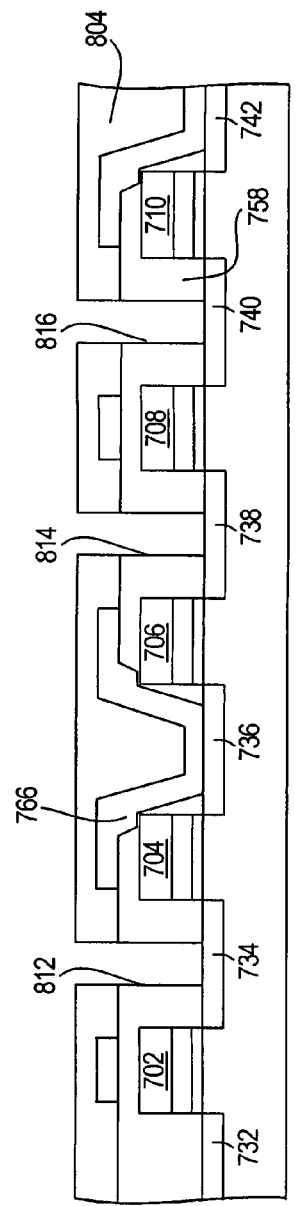

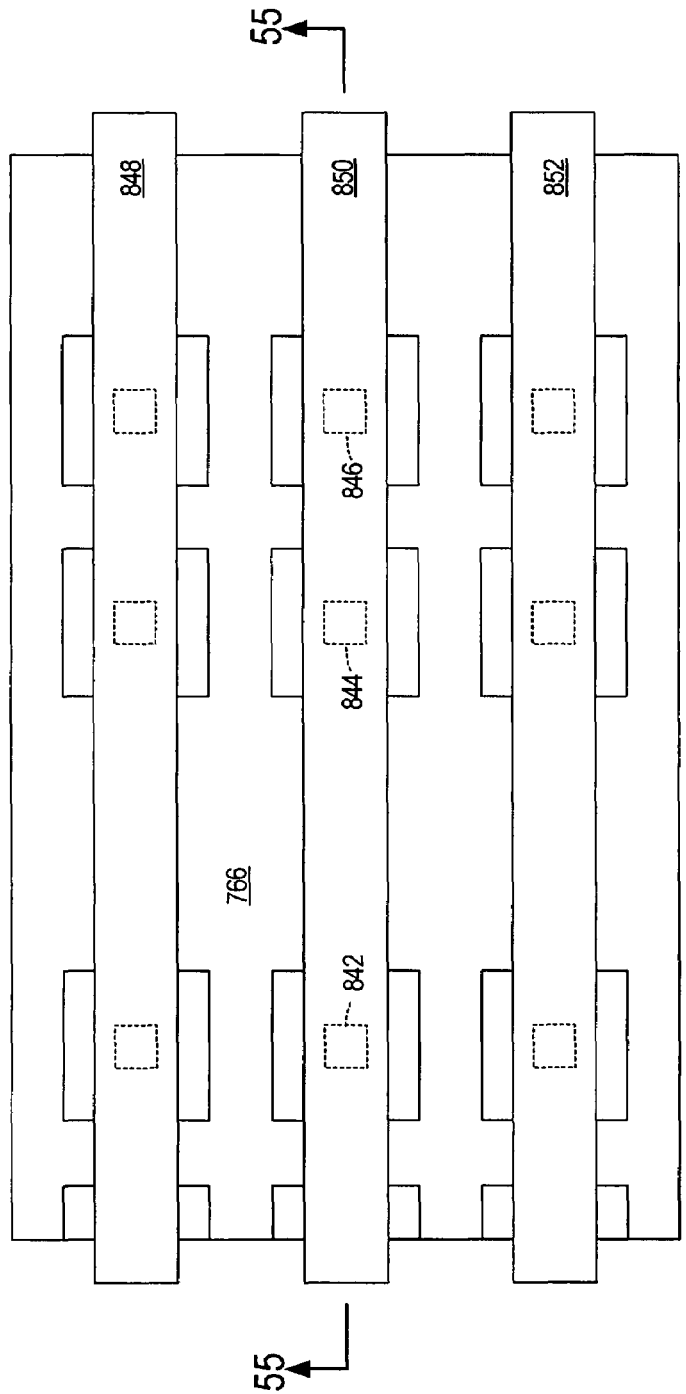
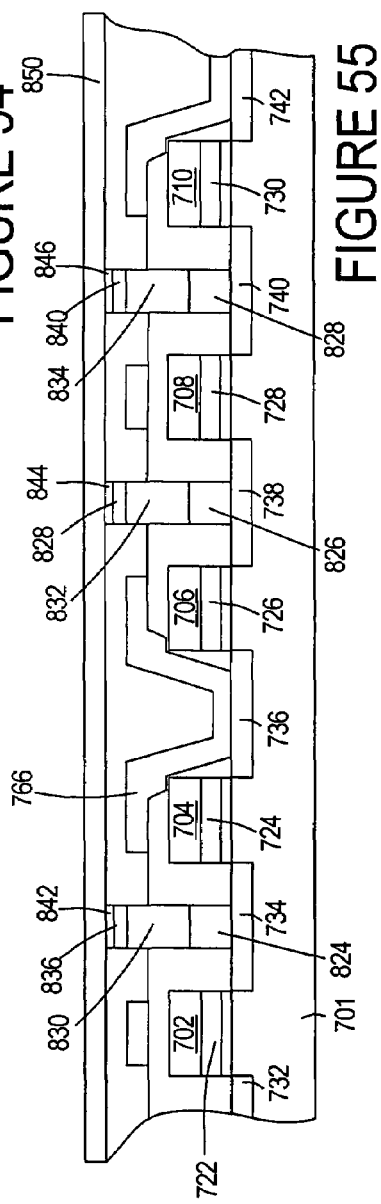

US 7,724,563 B2

MEMORY CELL ARRAY WITH LOW RESISTANCE COMMON SOURCE AND HIGH CURRENT DRIVABILITY

This is a Divisional Application of U.S. patent application Ser. No. 11/412,574, entitled MEMORY CELL ARRAY WITH LOW RESISTANCE COMMON SOURCE AND HIGH CURRENT DRIVABILITY, filed Apr. 27, 2006, assigned to Spansion LLC.

BACKGROUND OF THE INVENTION

1. Technical Field

This invention relates generally to memory devices, and more particularly, to a memory array which includes a plurality of resistive memory devices.

2. Background Art

FIG. 1 is a schematic representation of a portion of a DRAM memory array 100 proposed for 1-mega-bit class density. The array 100 includes a plurality of word lines (two shown at WL0, WL1), and a plurality of bit lines (one shown at BL0). The array includes a large number of similar memory cells (two memory cells MC0, MC1 shown in FIG. 1). The memory cell MC0 includes a capacitor C0 having one plate C0P1 connected to bit line BL0 and the other plate C0P2 connected to the drain D0 of an MOS transistor T0. The word line WL0 is connected to the gate G0 of the transistor T0. Likewise, the memory cell MC1 includes a capacitor C1 having one plate C1P1 connected to bit line BL0 and the other plate C1P2 connected to the drain D1 of an MOS transistor T1. The sources S0, S1 of these transistors T0, T1 are connected together, resulting in what is called a common-source (CS) memory array 100. It will be understood that the two cells MC0, MC1 shown and described are part of a large number of such memory cells in the array 100.

The data storing mechanism of each memory cell is based upon the presence or absence of electric charge accumulated in the capacitor. The presence or absence of the electric charge in the capacitor can be sensed by means of sense amplifier SA (connected to a bit line BL0), sensing current in the bit line BL0.

FIG. 2 is a cross-sectional view of an implementation of the structure of FIG. 1. As shown, the structure of FIG. 2 includes a p type silicon semiconductor substrate SS having spaced n+ diffused regions n+1, n+1, n+3 therein. The region n+1 and the region n+2 make up the drain and source of transistor T0 which includes gate oxide and gate WL0 (G0), while the region n+3 and the region n+2 make up the drain and source of transistor T1 which includes gate oxide and gate WL1 (G1). Polycrystalline silicon layers C0P2, C1P2 are provided in contact with the respective drain regions n+1, n+3 of the transistors T0, T1, and a dielectric film I is provided as shown, separating the layers C0P2, C1P2 from the gates WL0, WL1 of the transistors T0, T1. A layer of metal BL0 is formed over the dielectric film I. The metal layer BL0 is separated from the polycrystalline silicon layers C0P2, C1P2 by the dielectric film I, so that metal layer BL0 and layer C0P2 form capacitor G0, while metal layer BL0 and layer C1P2 form capacitor C1. The central n+ region n+2, commonly used by the transistors T0, T1, acts as the common source of the transistors T0, T1.

FIG. 3 is a graph illustrating typical drain-to-source (IDS) current flow through a transistor of the array as described above, for increasing drain-to-source voltage (VDS), based on increasing steps in the gate-to-source voltage (VGS) of the transistor. If VDS and VGS are kept relatively low (for example with VGS limited to 2 V, and VDS limited to 3 V, current through the transistor is limited to 30 ua).

FIG. 4 illustrates a two-terminal metal-insulator-metal (MIM) resistive memory device 130. The memory device 130 includes a metal, for example copper electrode 132, an active layer 134 of for example copper oxide on and in contact with the electrode 132, and a metal, for example copper electrode 136 on and in contact with the active layer 134. With reference to FIG. 5, initially, assuming that the memory device 130 is unprogrammed, in order to program the memory device 130, ground is applied to the electrode 132, while a positive voltage is applied to electrode 136, so that an electrical potential $V_{pg}$ (the "programming" electrical potential) is applied across the memory device 130 from a higher to a lower electrical potential in the direction from electrode 136 to electrode 132. Upon removal of such potential the memory device 130 remains in a conductive or low-resistance state having an on-state resistance.

In the read step of the memory device 130 in its programmed (conductive) state, an electrical potential $V_r$ (the "read" electrical potential) is applied across the memory device 130 from a higher to a lower electrical potential in the direction from electrode 136 to electrode 132. This electrical potential is less than the electrical potential $V_{pg}$ applied across the memory device 130 for programming (see above). In this situation, the memory device 130 will readily conduct current, which indicates that the memory device 130 is in its programmed state.

In order to erase the memory device 130, a positive voltage is applied to the electrode 132, while the electrode 136 is held at ground, so that an electrical potential Ver (the "erase" electrical potential) is applied across the memory device 130 from a higher to a lower electrical potential in the direction of from electrode 132 to electrode 136.

In the read step of the memory device 130 in its erased (substantially non-conductive) state, the electrical potential $V_r$ is again applied across the memory device 130 from a higher to a lower electrical potential in the direction from electrode 136 to electrode 132 as described above. With the active layer 134 (and memory device 130) in a high-resistance or substantially non-conductive state, the memory device 130 will not conduct significant current, which indicates that the memory device 130 is in its erased state.

FIG. 6 is a schematic representation of a portion of a typical resistive memory device array 200. The array 200 includes a plurality of word lines (two shown at WL0, WL1), and a plurality of bit lines (one shown at BL0). The array 200 includes a large number of similar memory cells (two memory cells M0, M1 shown in FIG. 6). The memory cell M0 includes a resistive memory device RM0 as described above and as illustrated in FIG. 4, having one electrode RM0E1 connected to bit line BL0 and the other electrode RM0E2 connected to the drain D0 of an MOS transistor T0. The word line WL0 is connected to the gate G0 of the transistor T0. Likewise, the memory cell M1 includes a resistive memory device RM1 having one electrode RM1E1 connected to bit line BL0 and the other electrode RM1E2 connected to the drain D1 of an MOS transistor T1. The sources S0, S1 of these transistors T0, T1 are connected together, resulting in a common-source (CS) memory array. It will be understood that the two cells M1, M2 shown and described are part of a large number of such memory cells in the array 200. A sense amplifier SA is connected to bit line.

It will be seen that the structure of FIG. 6 is similar to that of FIG. 1, but with the capacitors replaced by resistive memory devices.

FIG. 7 illustrates a larger portion of the array 200 of FIG. 6, with the common source CS connected to ground. Typically, the programming and erasing of a resistive memory device of the array 200 requires a substantially larger current therethrough than the current described above for a DRAM cell. In addition, and with reference to FIG. 7, with a large number of bit lines connected to each word line (for example bit lines BL0-BL7 connected to a word line WL0, or in actual implementation more than 256 bit lines connected to the same section driving line to minimize array area), it will be seen that upon selection of a word line, for example word line WL0, all current in the bit lines BL0-BL7 will flow through the common source CS to ground. These conditions result in the common source CS carrying high levels of current. In such situation, it is highly desirable to provide a low common source resistance, to reduce voltage drop therein, so as to keep the operating speed at an appropriate level, and to also provide high transistor drivability attributable to the grounded source bias condition to insure high performance of the array.

Therefore, what is needed is a resistive memory device array which includes a low-resistance common source and high drivability characteristics.

DISCLOSURE OF THE INVENTION

Broadly stated, the present semiconductor device comprises a substrate, a plurality of source regions in the substrate, and an elongated conductor connecting the plurality of source regions, the elongated conductor, along the length thereof, being positioned adjacent to the substrate to form, with the plurality of source regions, a common source.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 9-23 illustrate process steps for fabricating a first embodiment of array in accordance with FIG. 8;

FIGS. 24-33 illustrate process steps for fabricating a second embodiment of array in accordance with FIG. 8;

FIGS. 35-55 illustrate process steps for fabricating an embodiment of array in accordance with FIG. 34.

BEST MODE(S) FOR CARRYING OUT THE INVENTION

Reference is now made in detail to specific embodiments of the present invention which illustrate the best mode presently contemplated by the inventor for practicing the invention. In the plan views shown and described, some of the structure is removed for clarity.

Figure 1:
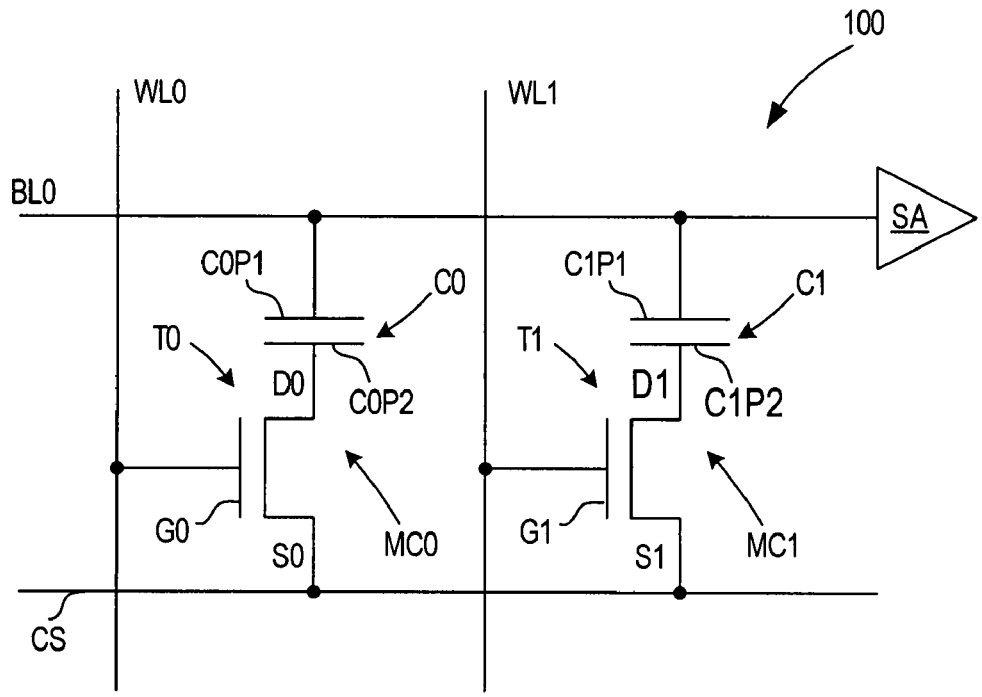
FIG. 1 is a schematic representation of a portion of a DRAM memory array.
Figure 2:
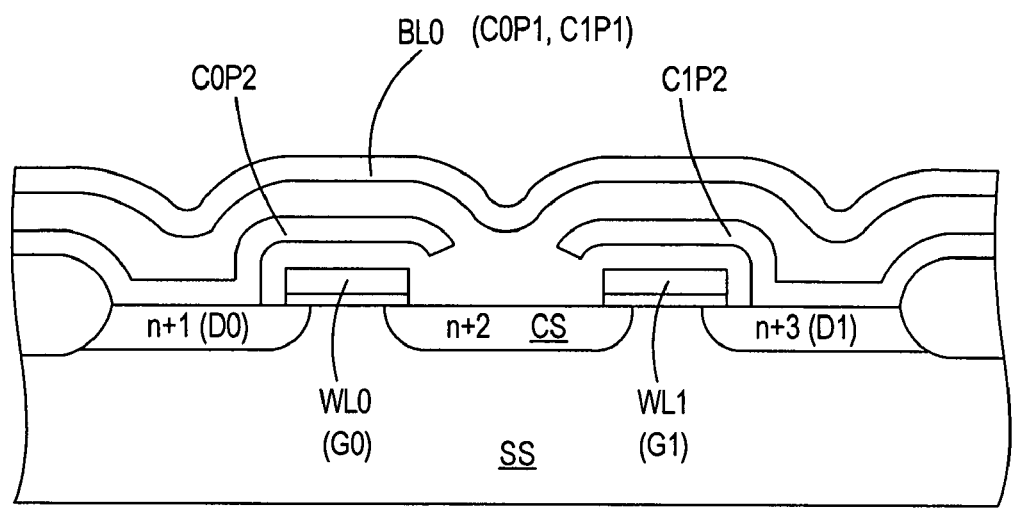
FIG. 2 is a cross sectional view of an implementation of the array of FIG. 1.
Figure 3:
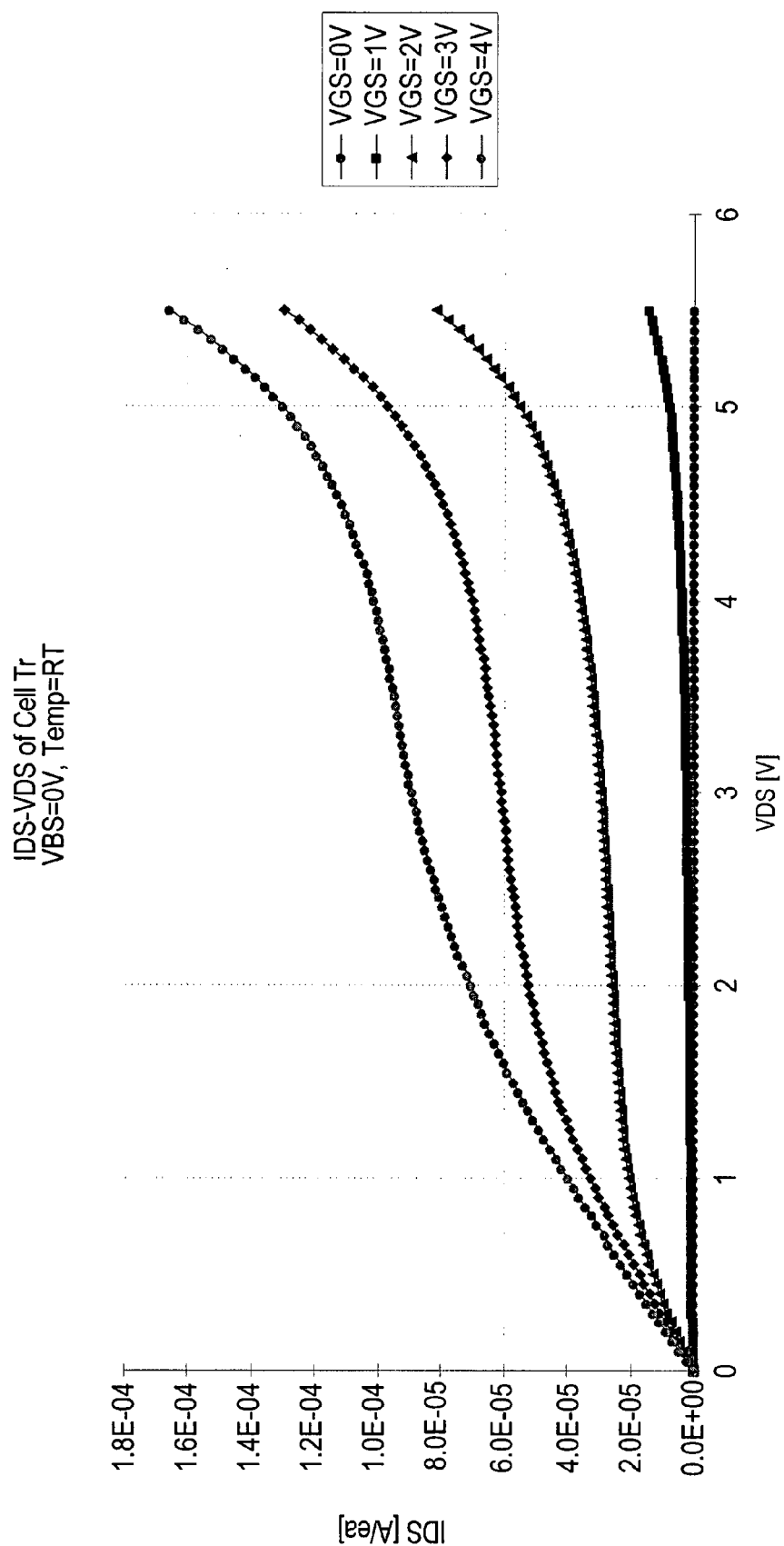
FIG. 3 is a graph illustrating typical drain-to-source (IDS) current flow through a transistor of the array of FIG. 1.
Figure 4:
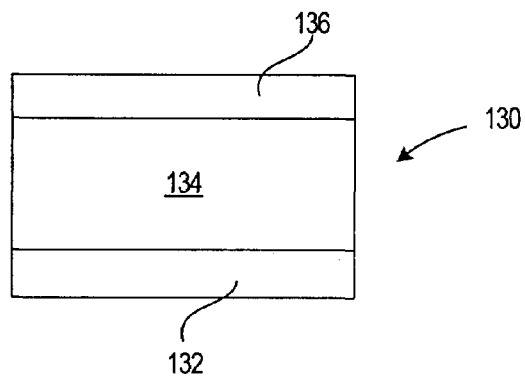
FIG. 4 is a cross sectional view of a resistive memory device for practice of the present invention.
Figure 5:
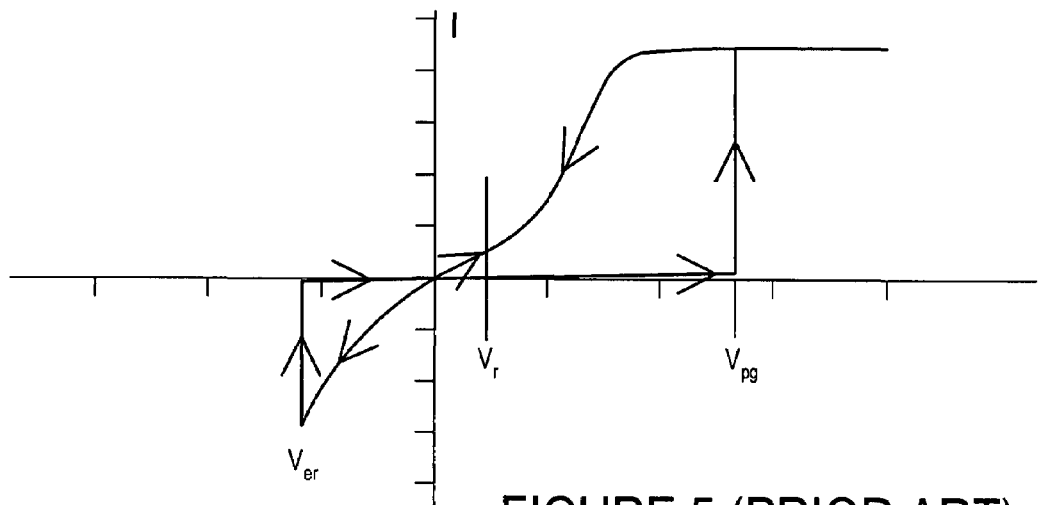
FIG. 5 is a plot of current vs. voltage illustrating operating characteristics of the memory device of FIG. 4.
Figure 6:
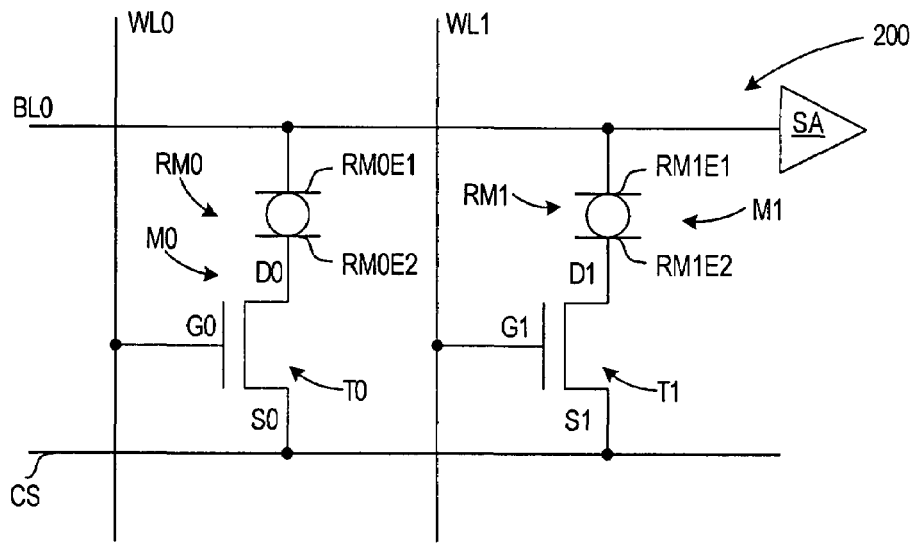
FIG. 6 is a schematic representation of a portion of a the present resistive memory array.
Figure 7:
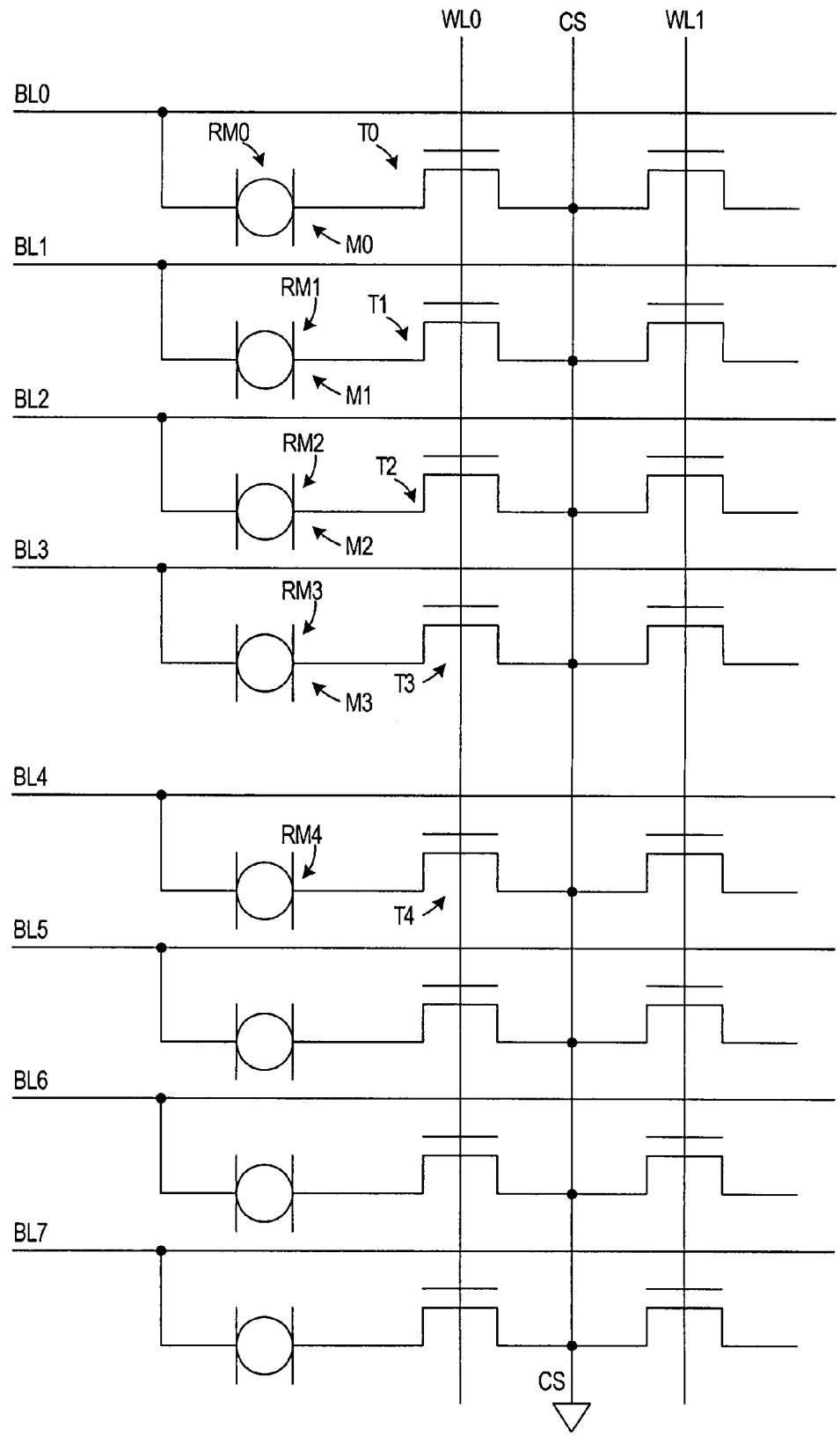
FIG. 7 is a schematic representation of a larger portion of a the resistive memory array of FIG. 6.
Figure 8:
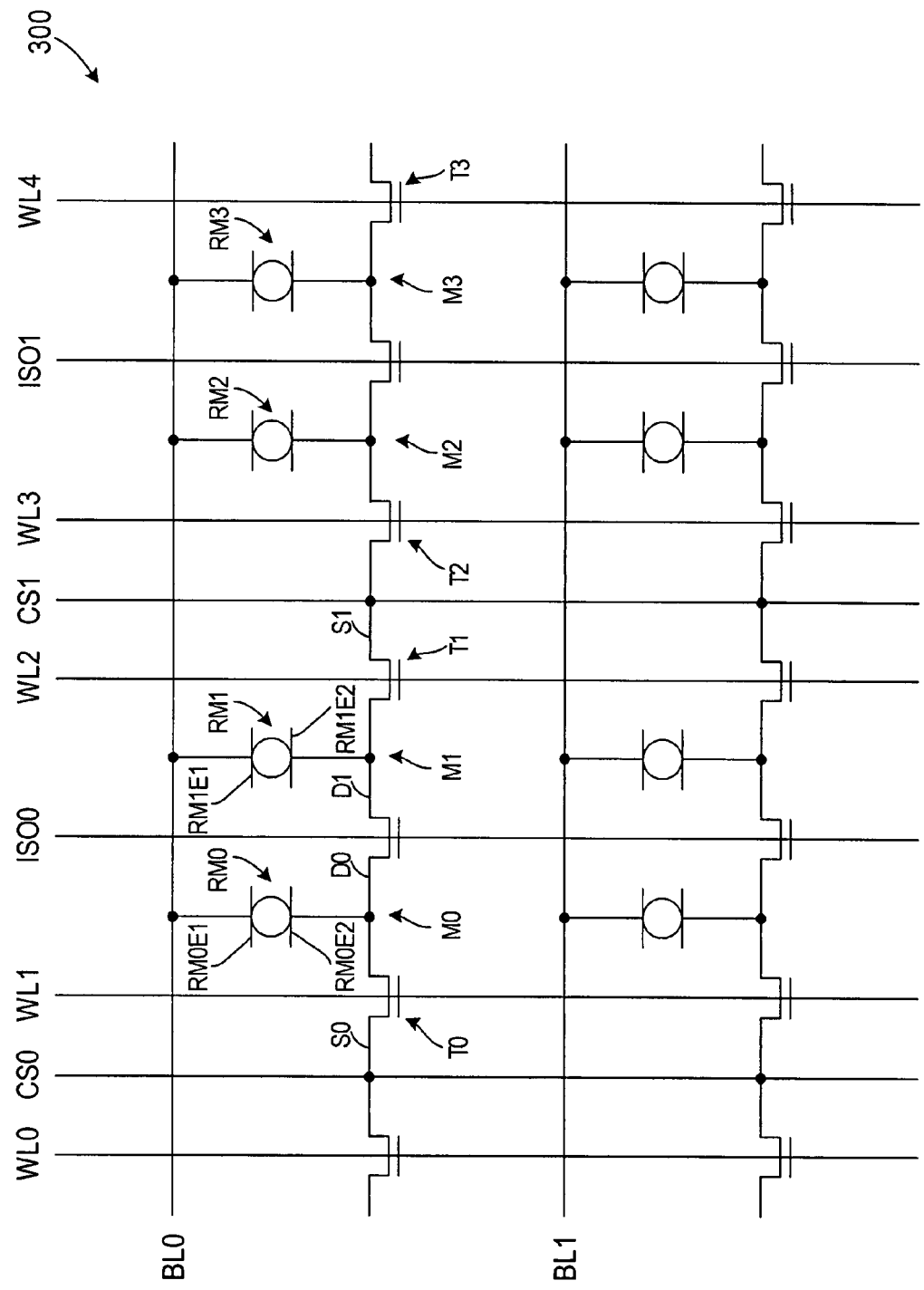
FIG. 8 is a schematic representation of the present embodiment of resistive memory device array incorporating memory cells as shown and described above.

FIG. 8 is a schematic representation of a resistive memory device array 300 made in accordance with the present invention. It will be understood that FIG. 8 illustrates a very small portion of the overall array. The array 300 includes a plurality of word lines WL0, WL1, WL2 WL3, WL4 ... and a plurality of bit lines BL0, BL1 ... orthogonal to the word lines. Common source line CS0 is provided between word lines WL0, WL1, common source line CS1 is provided between WL2, WL3, etc, as shown. Word lines WL1, WL2 are separated by isolation region ISO0, word lines WL3, WL4 are separated by isolation region ISO1, etc., as shown. A plurality of memory cells M0, M1, M2, M3 ... are provided, each including a resistive memory device (RM0, RM1, RM2, RM3 ... respectively) which may take the form of that shown and described above in regard to FIGS. 3 and 4, and an access MOS transistor (T0, T1, T2, T3) in series with the associated resistive memory device. That is, for example, the memory cell M0 includes resistive memory device RM0 having one electrode RM0E1 thereof connected to bit line BL0 and the other electrode RM0E2 thereof connected to the drain D0 of transistor T0, with the source S0 of that transistor T0 connected to the common source line CS0. Similarly, the memory cell M1 includes resistive memory device RM1 having one electrode RM1E1 thereof connected to bit line BL0 and the other electrode RM1E2 thereof connected to the drain D1 of transistor T1, with the source S1 of that transistor connected to the common source line CS1. Isolation regions ISO0, ISO1 ... separate adjacent pairs of memory devices. It will be seen that the other memory cells of the array 300 are configured and connected in the manner as shown and described.

Figure 9:
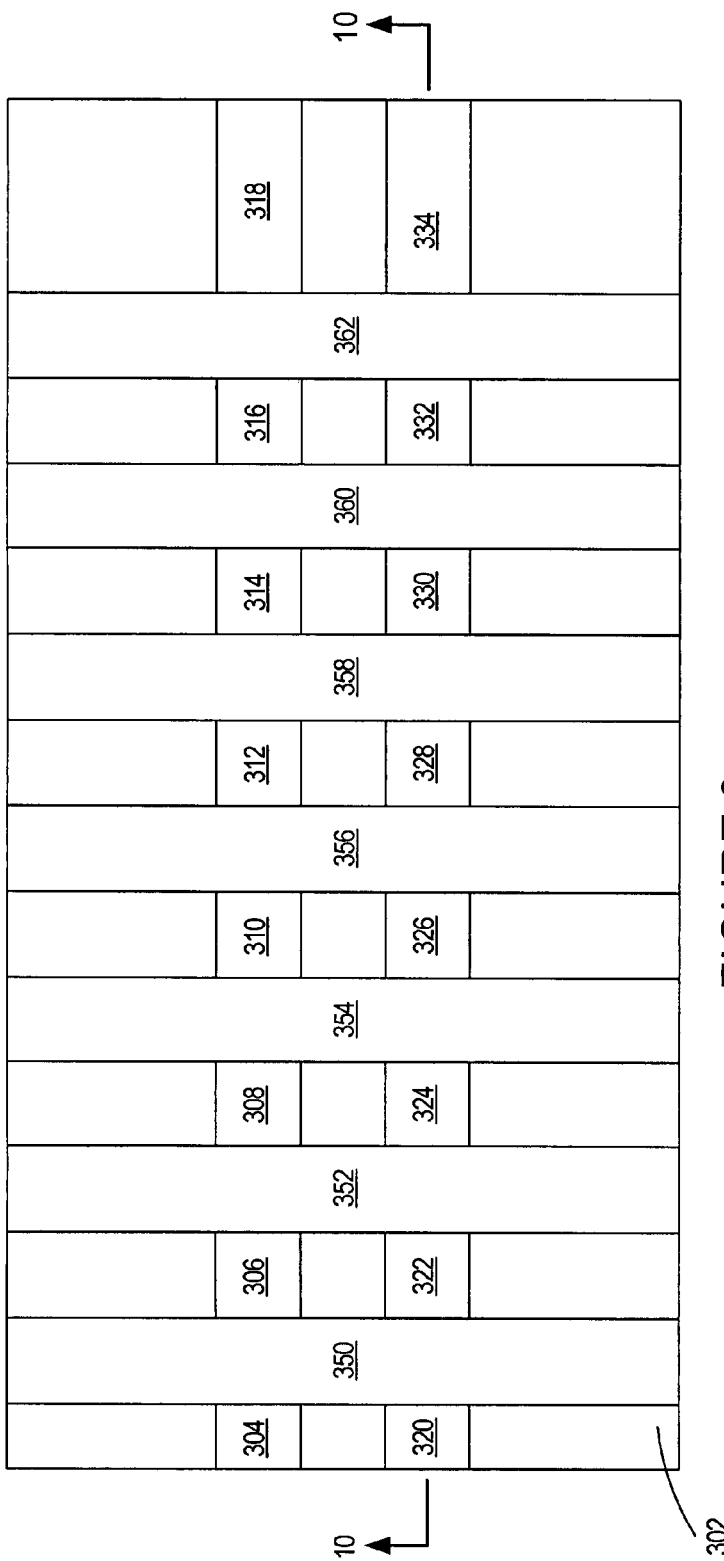
Figure 10:
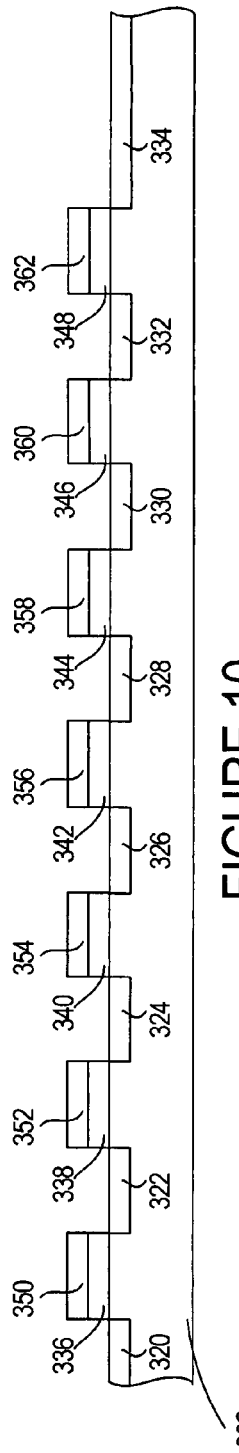
Figure 11:
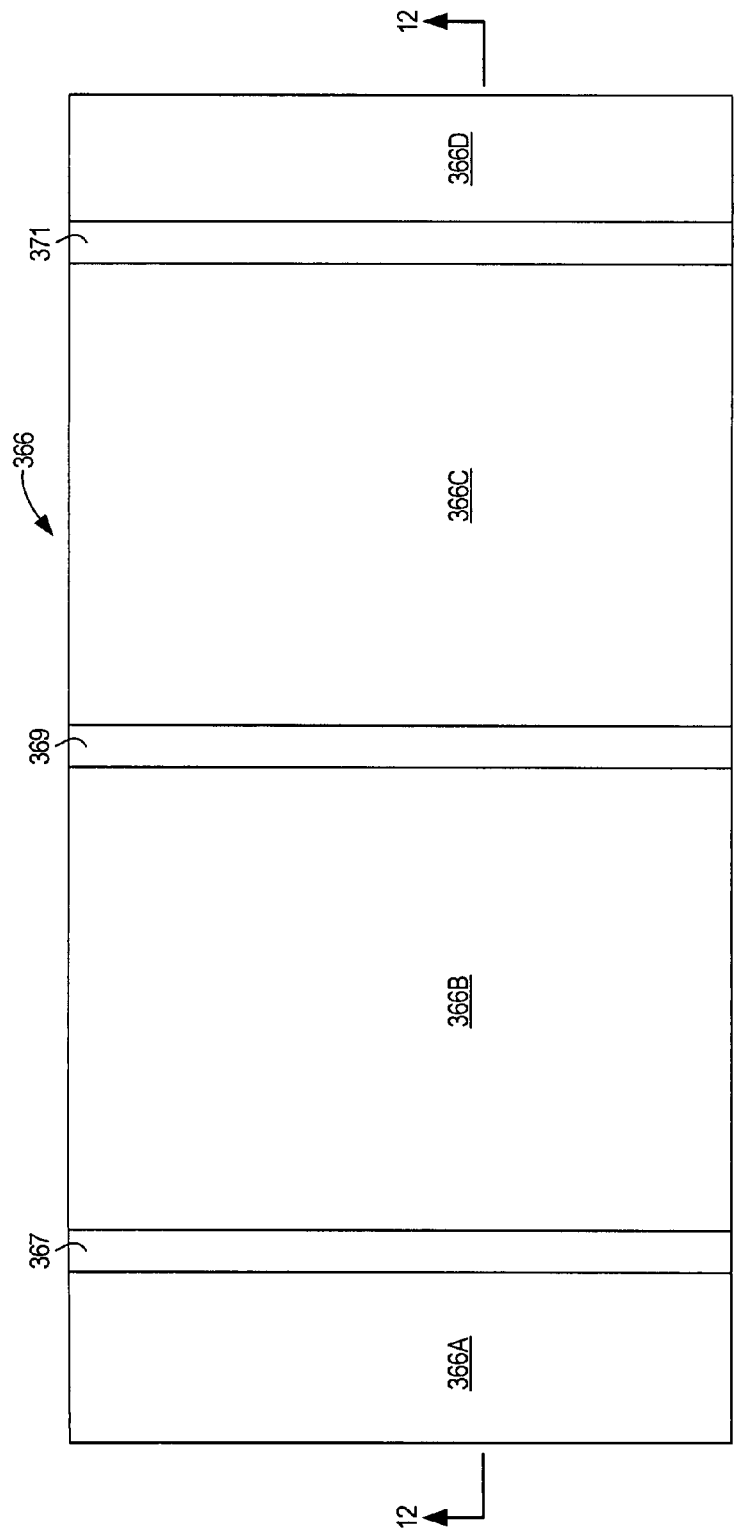
Figure 12:
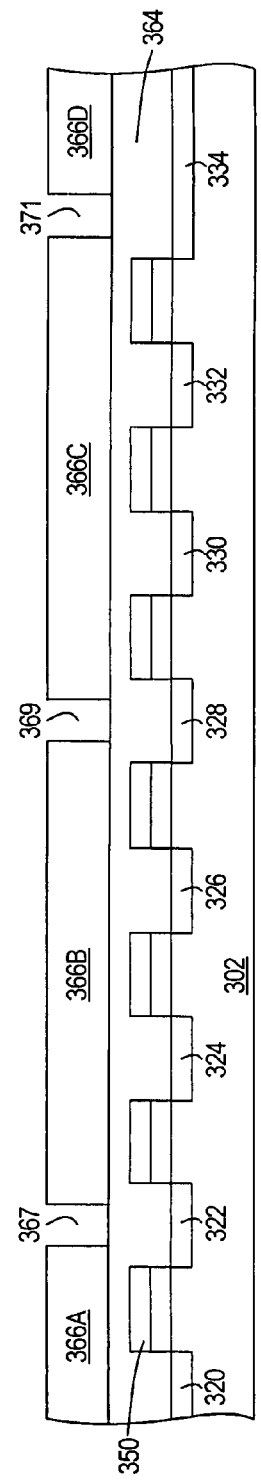
Figure 13:
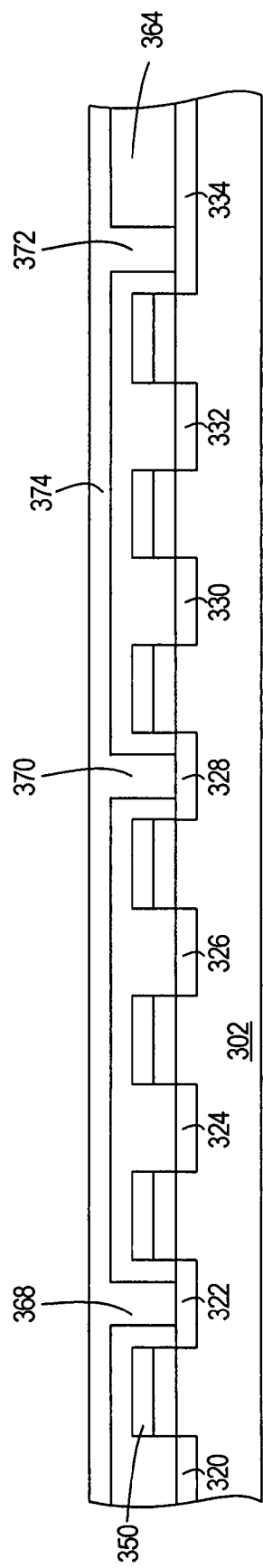
Figure 14:
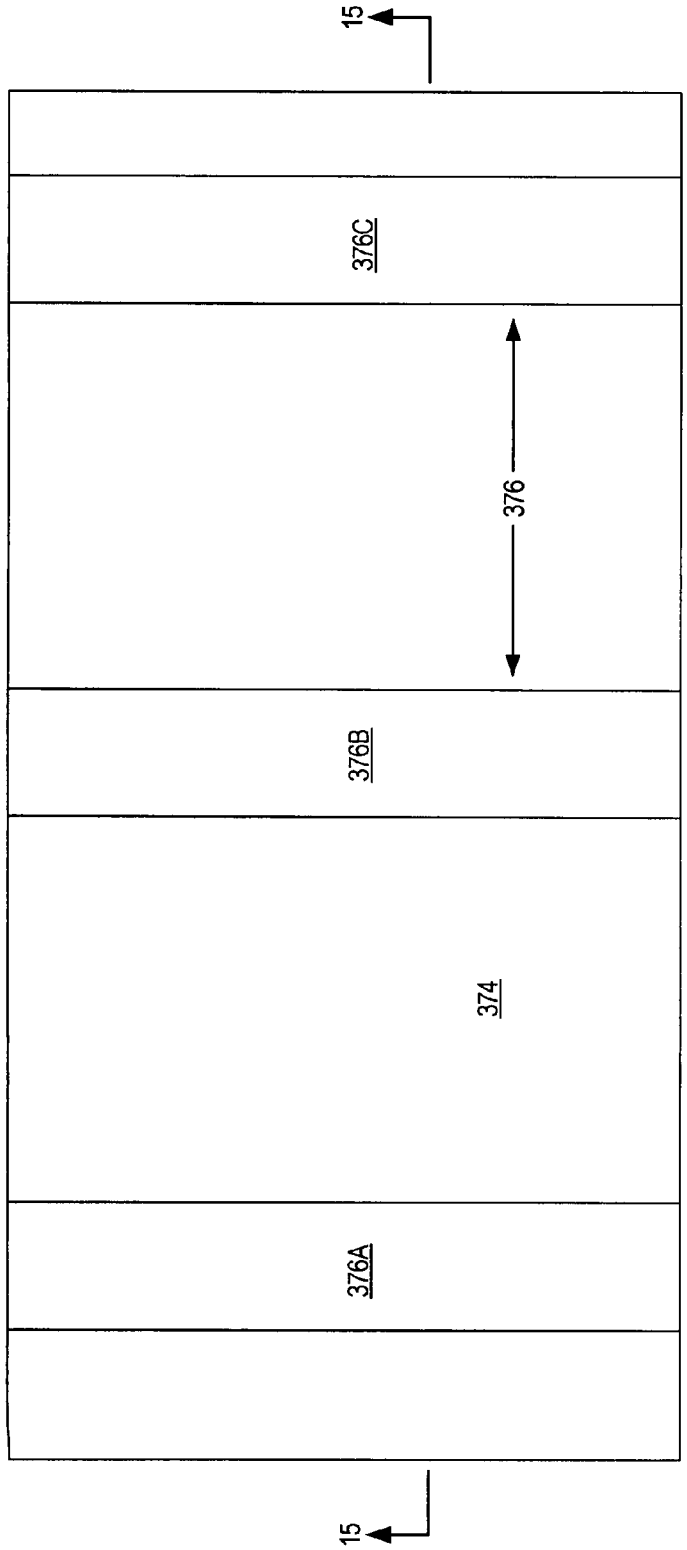
Figure 15:
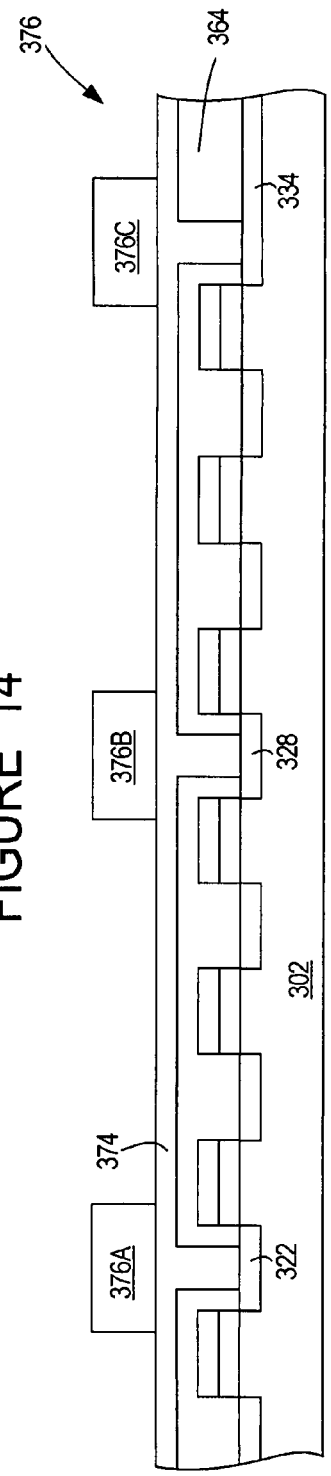
Figure 16:
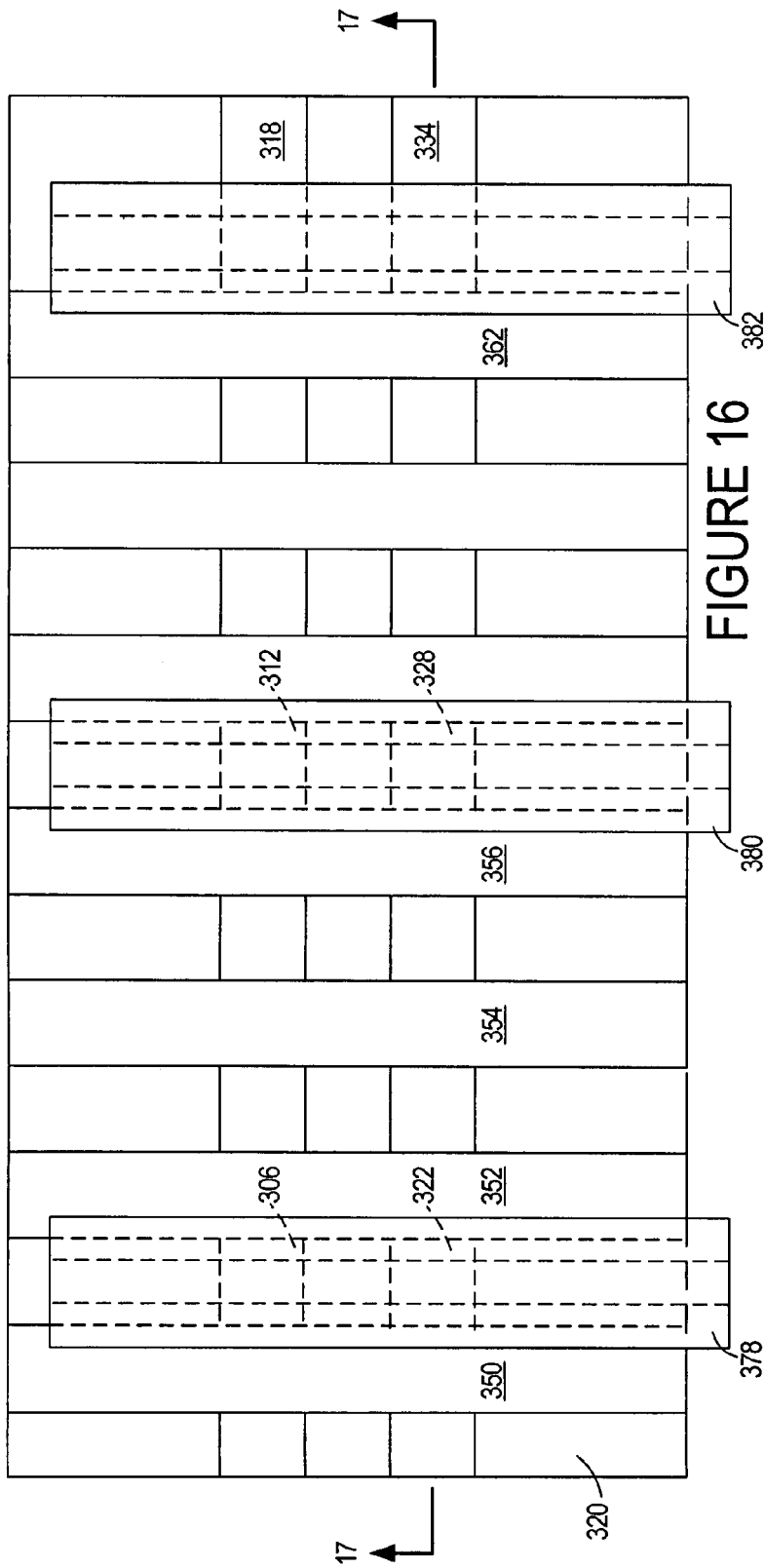
Figure 17:
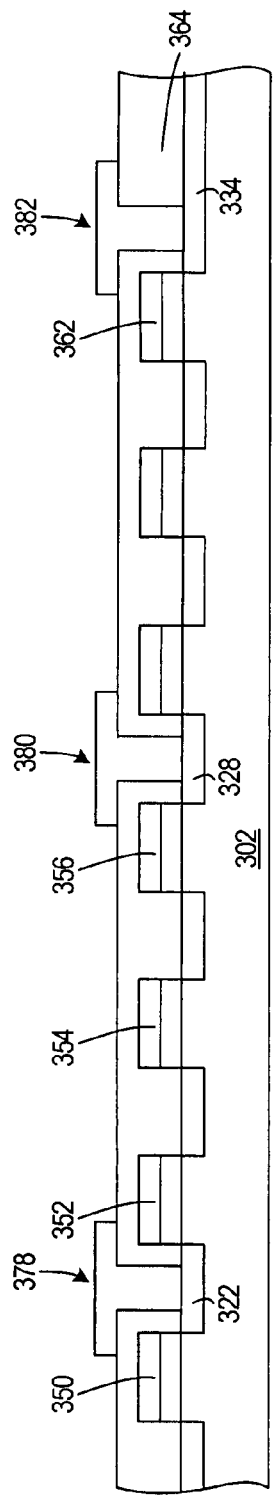

A method of fabricating the array 300 of FIG. 8 is illustrated in FIGS. 9-23. Initially, and with reference to FIGS. 9 and 10, a p type silicon semiconductor substrate 302 is provided, and through the use of well-known techniques, a plurality of isolated n+ diffused regions 304-334 are provided in the substrate 302. Spaced oxide strips 336-348 are provided on the substrate 302 as shown, over and on which are provided respective polysilicon strips 350-362. Next, with reference to FIGS. 11 and 12, a dielectric layer 364 is provided over the resulting structure, a layer of photoresist 366 is provided over the dielectric layer 364, and the photoresist layer 366 is patterned to provide photoresist bodies 366A, 366B, 366C, 366D with elongated openings 367, 369, 371 through the photoresist layer 366. Using the remaining photoresist as a mask, the dielectric layer 364 is etched to provide elongated openings 368, 370, 372 therethrough to the n+ regions thereunder. After removal of the photoresist, (FIG. 13), a metal layer 374 is provided over the resulting structure, the metal layer 374 contacting the respective n+ regions 306, 312, 318, 322, 328, 334. With reference to FIGS. 14 and 15, a layer of photoresist 376 is provided over the metal layer 374, and the photoresist layer 376 is patterned as shown, to provide elongated photoresist bodies 376A, 376B, 376C. Using the remaining photoresist as a mask, the metal layer 374 is etched, and the photoresist is removed to provide the structure shown in FIGS. 16 and 17. This step provides spaced-apart elongated metal conductors 378, 380, 382 running parallel to the polysilicon strips 350-362, elongated metal conductor 378 contacting and connecting the n+ regions 306, 322, elongated metal conductor 380 contacting and connecting the n+ regions 312, 328, and elongated metal conductor 382 contacting and connecting the n+ regions 318 and 334.

Figure 18:
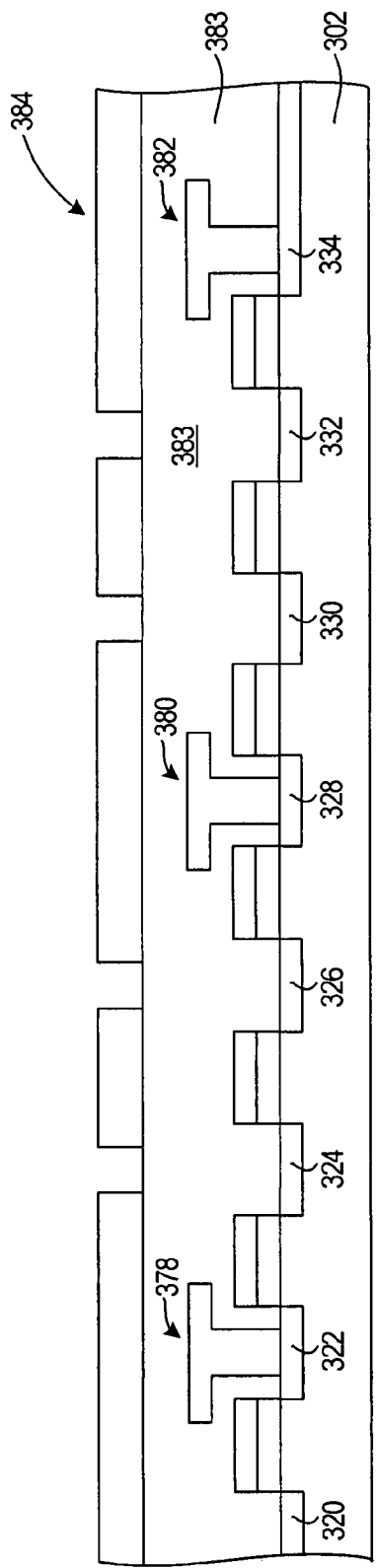
Figure 19:
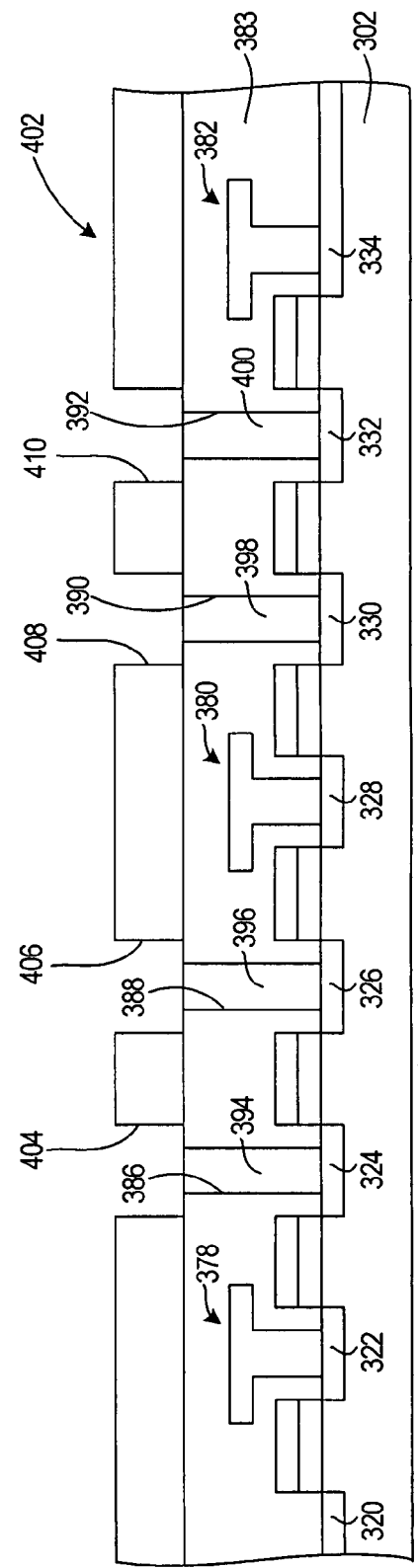
Figures 20, 21:
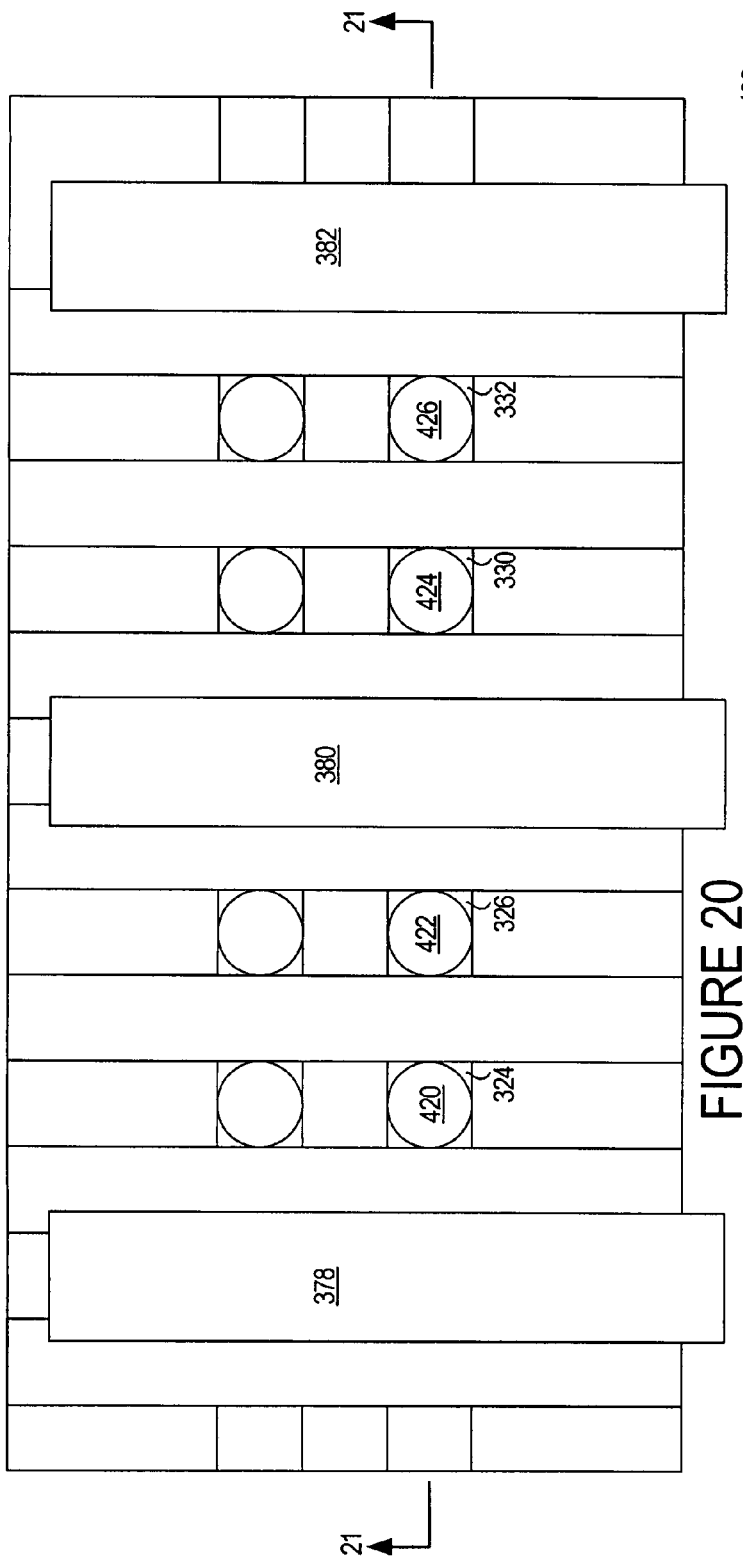

Next, with reference to FIGS. 18 and 19, additional dielectric is provided over the resulting structure to form the dielectric layer 383, a layer of photoresist 384 is provided over the dielectric layer 383, and the photoresist layer 384 is patterned as shown. Using the remaining photoresist as a mask, the dielectric layer 383 is etched to provide openings therethrough to respective n+ regions. (The following description references openings 386, 388, 390, 392 and n+ regions 324, 326, 330, 332, but it will be understood that this description is applicable to n+ regions 308, 310, 314, 316 also). Conductive metal plugs 394, 396, 398, 400 are provided in the openings formed by this etching to contact the exposed n+ regions 324, 326, 330, 332 respectively. A dielectric layer 402 is formed over the resulting structure and is patterned in the manner described above to provide openings 404, 406, 408, 410 therethrough to the respective plugs 394, 396, 398, 400 (FIG. 19). Referring to FIGS. 20 and 21, the openings 404, 406, 408, 410 in the dielectric layer 402 are partially filled with copper 412, 414, 416, 418, in contact with the respective plugs 394, 396, 398, 400. The openings 404, 406, 408, 410 are then filled with active material layer, for example, copper oxide 420, 422, 424, 426. The resulting structure is planarized, and metal, for example copper strips 428, 430 are formed over the resulting structure orthogonal to the polysilicon strips 350-362, each strip 428, 430 in contact with a series of copper oxide active layers as shown (FIGS. 22 and 23).

The polysilicon strips 350, 352, 356, 358, 362 are the gates (overlying gate oxide) of respective access transistors 434, 436, 438, 440, 442 and make up the word lines of the array 300, while the metal strips 428, 430 make up the bit lines thereof. As an example, the access transistor 434 includes n+ drain region 320, gate 350 and n+ source region 322, while the access transistor 436 includes n+ drain region 324, gate 352 and n+ source region 322. The plug 394 contacts the drain region 324 of access transistor 436, connecting the drain region 324 thereof to the resistive memory device 450 made up of the copper body 412, copper oxide body 420, and copper bit line 430. Similarly, the access transistor 438 includes n+ drain 326, gate 356 and n+ source region 328, while the access transistor 440 includes n+ drain region 330, gate 358 and n+ source region 328. The plug 396 contacts the drain region 326 of access transistor 438, connecting the drain region 326 thereof to the resistive memory device 452 made up of the copper body 414, copper oxide body 422, and copper bit line 430. The resistive memory devices 450, 452 are thus positioned between the source regions 306, 322 and the source regions 312, 328, and in turn between the conductor 378 and the conductor 380. The structure between the adjacent memory devices (for example between memory devices 450, 452) acts as an isolation region in the array 300.

As will be seen, each elongated metal conductor 378, 380, 382 is positioned adjacent to and on the substrate 302 and connects a plurality of spaced source regions arranged in a column of source regions. As such, each elongated metal conductor 378, 380, 382 forms with the source regions connected thereto a common source. Each conductor 378, 380, 382 is substantially straight along its length, and the conductors 378, 380, 382 are substantially parallel and in spaced relation. Each conductor is generally T-shaped in cross-section, that is each conductor includes a relatively narrow first portion (for example portion 378A of conductor 378) in contact with the source regions (306, 322), that first portion 378A being narrower in cross-sectional width than the cross-sectional width of each of the associated source regions 306, 322. Each conductor further includes a relatively wide second portion (for example portion 378B of conductor 378) connected to the first portion (378A) and spaced from the substrate 302, wider in cross-sectional width than the cross-sectional width of the first portion, so that the first and second portions together defined the generally T-shaped cross-section thereof. Parts of the second portion of each conductor overlie portions of the gates of adjacent transistors (for example parts of portion 378B of conductor 378 overlie portions of the gates 350, 352).

The inclusion of the conductors 378, 380, 382 as configured connecting a series of source regions greatly reduces common source resistance. Each of the conductors 378, 380, 382 is relatively large in cross-section, providing minimal resistance to current flowing therethrough. With the particular cross-section of each conductor 378, 380, 382 as shown and described, each conductor takes up minimal substrate area, being relatively narrow in the area of contact to the substrate 302. Meanwhile, the conductor is much wider in the portion away from the substrate, where otherwise unused area is available. Thus, a common source is provided which meets the relatively high-current needs of resistive memory devices as described above, meanwhile using minimal substrate area.

Figure 24:
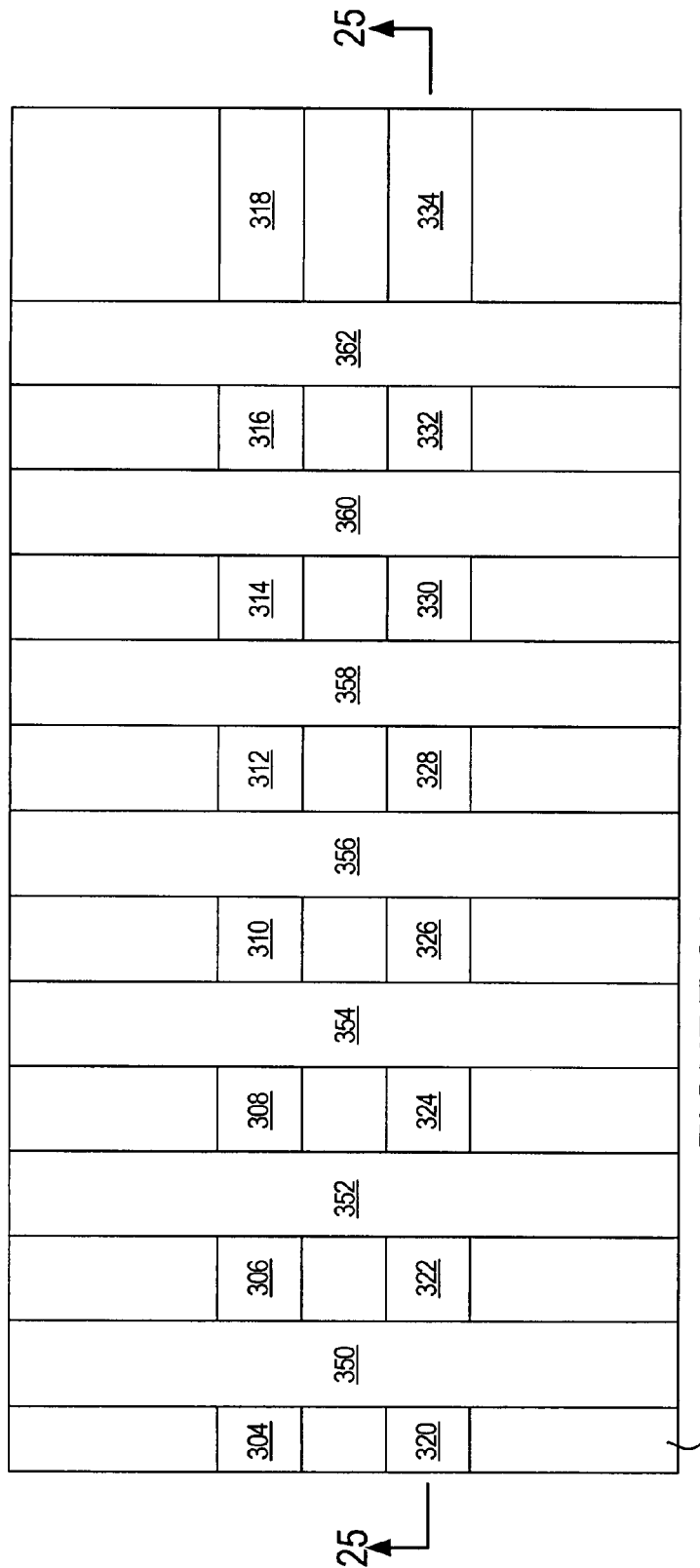
Figure 25:
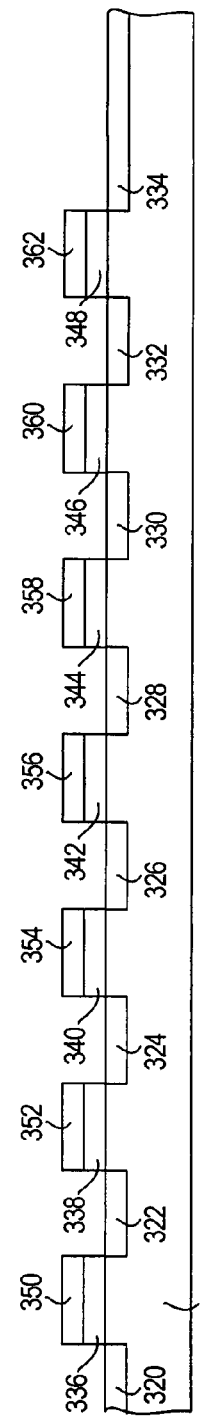
Figure 28:
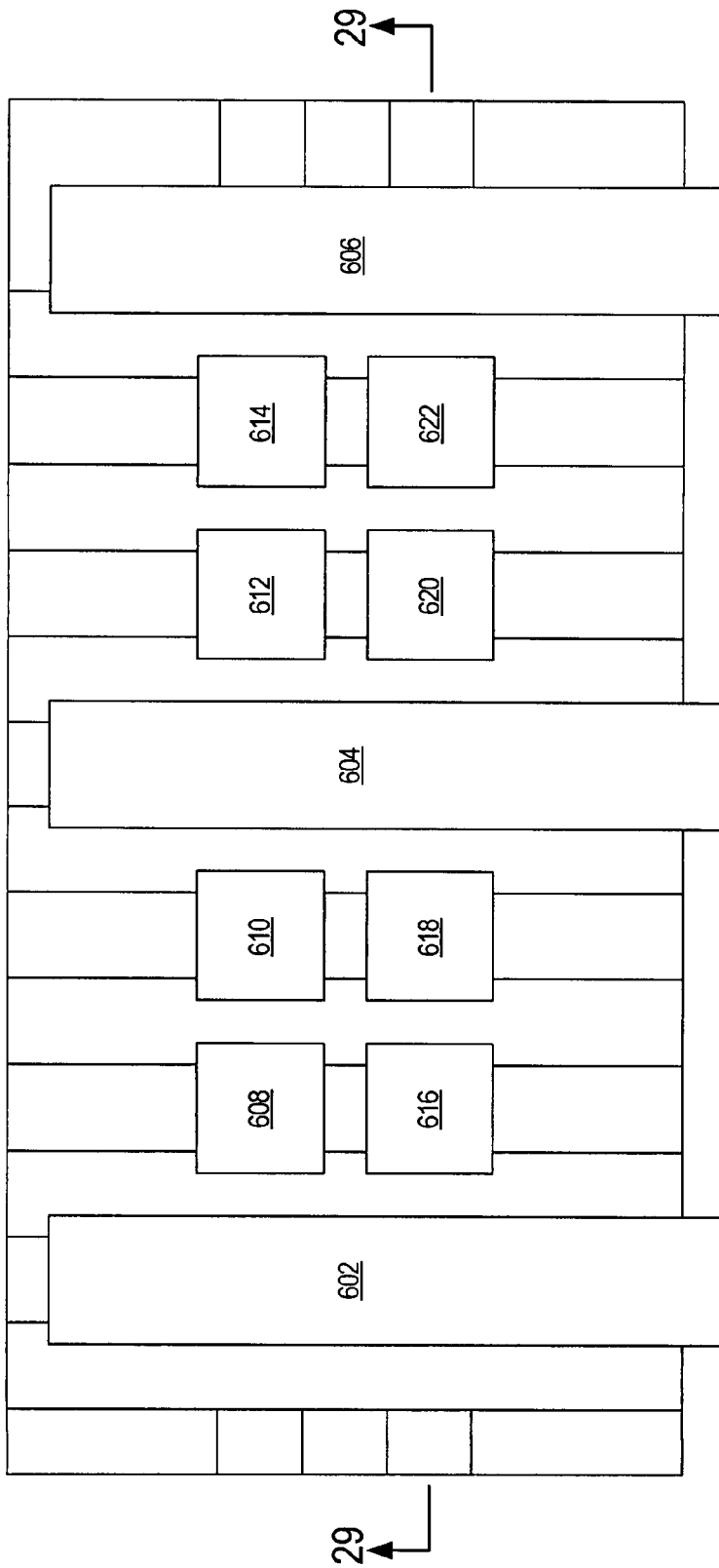
Figure 29:
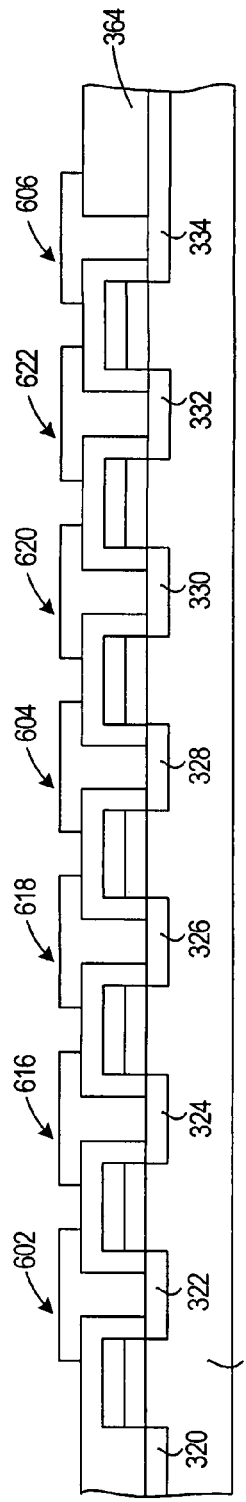

A second method of fabricating the array 300 of FIG. 8 is illustrated in FIGS. 24-33. With reference to FIGS. 24 and 25, similar to FIGS. 9 and 10, a p type silicon semiconductor substrate 302 is provided, and through the use of well-known techniques, a plurality of isolated n+ diffused regions 304-334 are provided in the substrate 302. Spaced oxide strips 336-348 are provided on the substrate 302 as shown, over and on which are provided respective polysilicon strips 350-362. After undertaking process steps similar to those shown and described with regard to FIGS. 11-13 above, a photoresist layer 600 is provided over the metal layer 374 (FIGS. 26 and 27). The photoresist layer 600 is patterned as shown, wherein elongated bodies 600A, 600B, 600C are provided, similar to the elongated bodies 376A, 376B, 376C of the previous embodiment (FIGS. 14 and 15). In addition, as part of the same lithographic process, generally rectangular bodies 600D-600K also remain as shown. Using the remaining photoresist as a mask, the metal layer 374 is etched, and the photoresist is removed to provide the structure shown in FIGS. 28 and 29. This step provides spaced-apart elongated metal conductors 602, 604, 606 running parallel to the polysilicon strips 350-362, elongated metal conductor 602 contacting and connecting the n+ regions 306, 322, elongated metal conductor 604 contacting and connecting the n+ regions 312, 328, and elongated metal conductor 606 contacting and connecting the n+ regions 318, 334, similar to the previous embodiment. In addition, this process forms conductive metal pedestals 608-622 in contact with the respective n+ regions 308, 310, 314, 316, 324, 326, 330, 332 in the substrate 302. Each pedestal, while not elongated, is similar in configuration and cross-section to the conductors 602, 604, 606. That is, each pedestal is generally T-shaped in cross-section, i.e., each pedestal includes a relatively narrow first portion (for example first portion 616A of pedestal 616 in contact with a drain region 324), that first portion 616A being narrower in cross-sectional width than the cross-sectional width of the associated drain region 324. Each pedestal further includes a relatively wide second portion (for example second portion 616B of pedestal 616 connected to the first portion 616A), spaced from the substrate 302, wider in cross-sectional width than the cross-sectional width of the first portion 616A, so that the first and second portions together defined the generally T-shaped cross-section thereof.

Figures 32, 33:
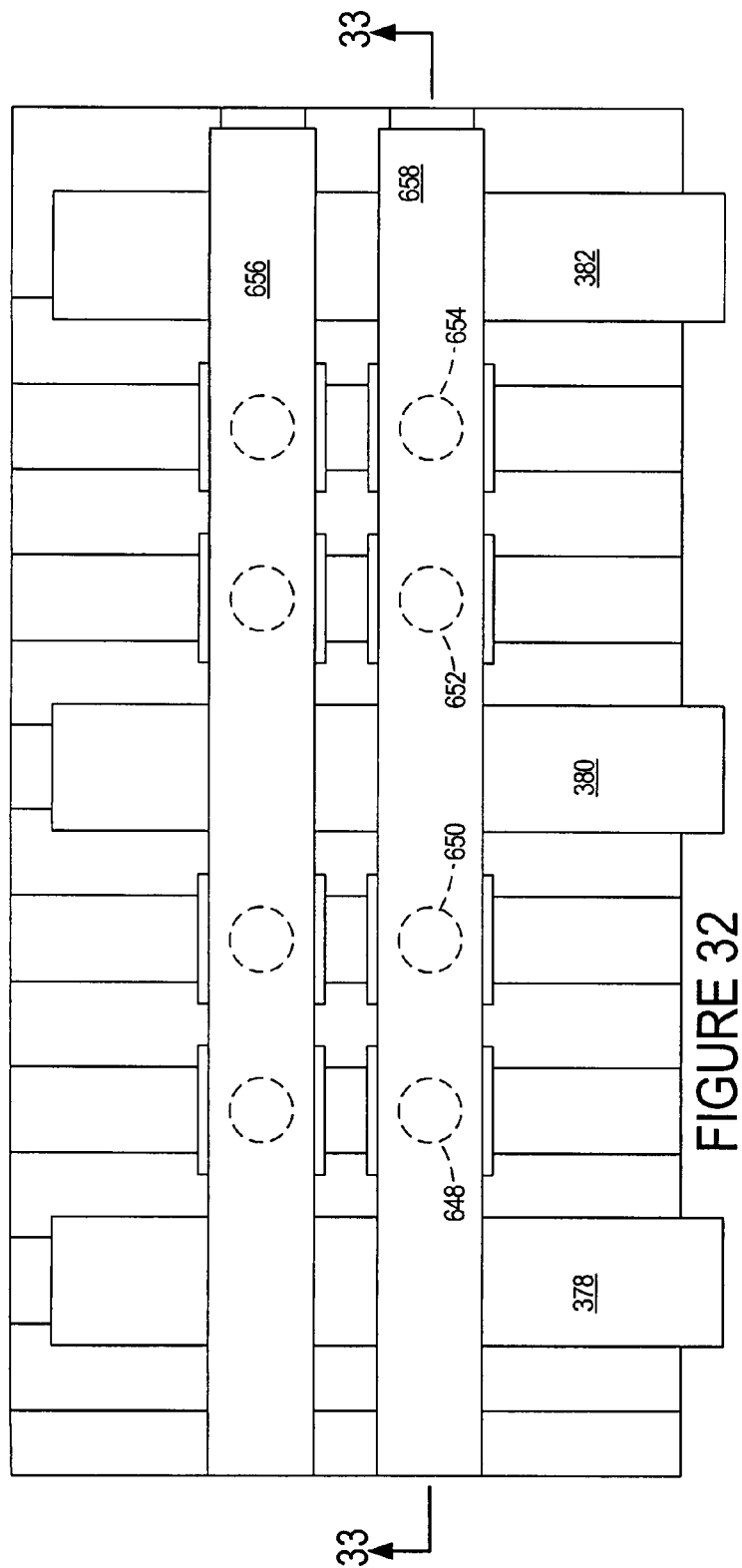

Next (FIGS. 30 and 31), a dielectric layer 628 is provided over the resulting structure and is patterned to provide openings to the pedestals (openings 630 636 shown in FIG. 31). Copper electrodes 640-646 and active regions 648-654 are formed in the openings as previously shown and described, and copper bit lines 656, 658 are provided (FIGS. 32 and 33).

It will be seen that the pedestals 608-622 replace the conductive plugs of the previous embodiment, and are formed using the same masking steps as in the formation of the conductive bodies 378-382. Thus, the present approach requires fewer processing steps than the previous approach.

Figure 34:
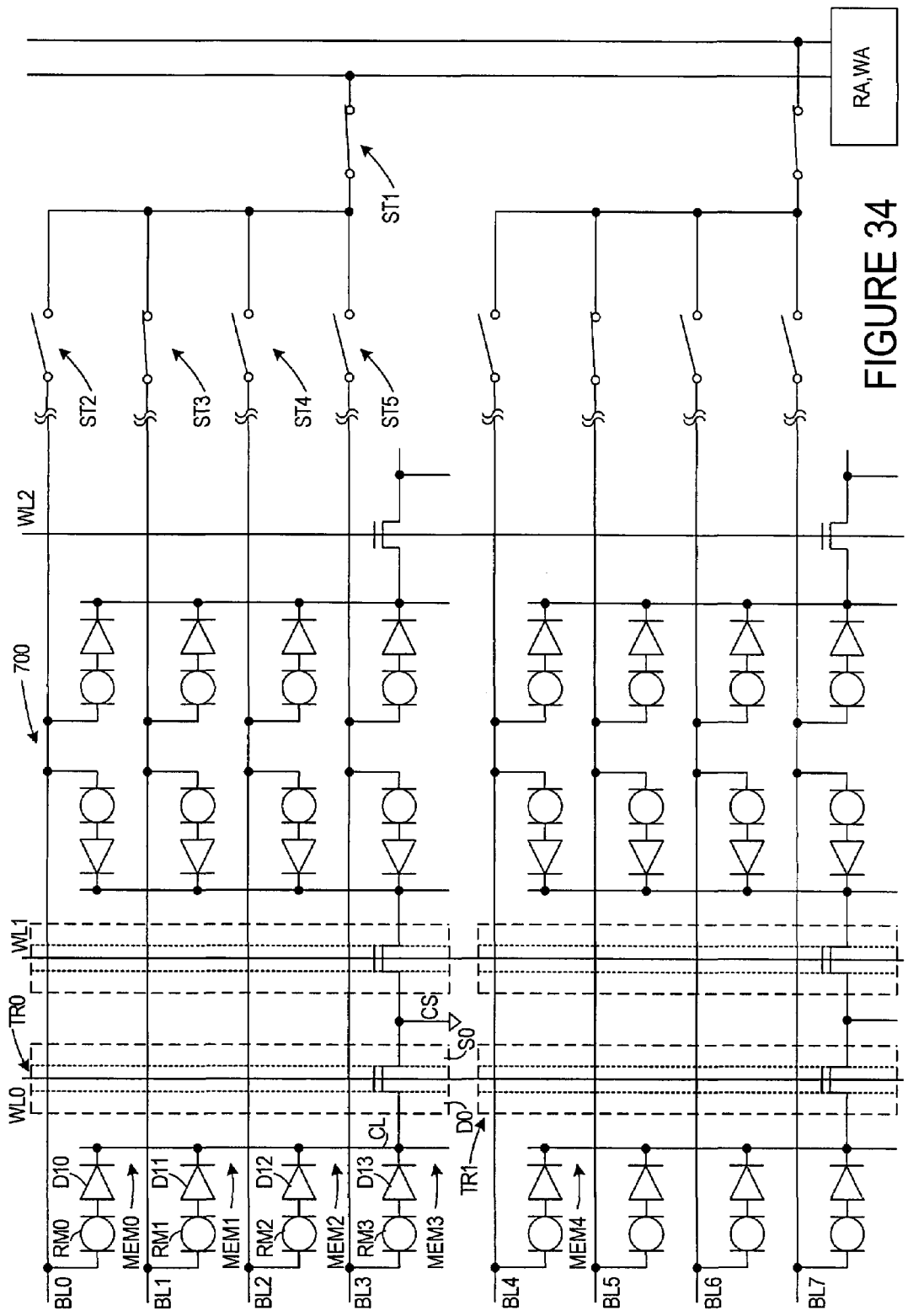
FIG. 34 is a schematic representation of another embodiment of resistive memory device array incorporating memory cells as shown and described above.

FIG. 34 is a schematic representation of another embodiment of resistive memory device array 700 made in accordance with the present invention. It will be understood that FIG. 34 illustrates a very small portion of the overall array. The array 700 includes a plurality of word lines WL0, WL1, WL2 . . . , and a plurality of bit lines BL0, BL1, BL2, BL3, BL4, BL5, BL6, BL7 . . . orthogonal to the word lines. A plurality of memory cells MEM0, MEM1, MEM2, MEM3 . . . are provided, each including a resistive memory device (for example resistive memory device RM0 of memory cell MEM0, etc.) which may take the form of that shown and described above in regard to FIGS. 3 and 4 (including first and second spaced electrodes and an active region therebetween and in contact therewith), a diode in series therewith (for example diode DI0 in series with memory device RM0, etc.), and an access transistor (for example access transistor TR0). The memory devices MEM0, MEM1, MEM2, MEM3 are connected to the respective bit lines BL0, BL1, BL2, BL3, and diodes DI0, DI1, DI2, DI3 connect the respective memory devices MEM0, MEM1, MEM2, MEM3 with the drain D0 of the transistor TR0 through a common line CL, with each diode being forward oriented in the direction from its associated bit line to the drain D0 of the transistor TR0. As will be seen, multiple sets of bit lines and resistive memory device-diode structures are associated with a single, large area transistor (in this example four sets of memory devices and diodes in series associated with a transistor), with each such memory device-diode structure connecting a bit line with the drain of the transistor. The word line WL0 is connected to the gate of the transistor TR0. The group of bit lines BL0, BL1, BL2, BL3 is accessed by a switching transistor ST1 connecting sense and write amplifiers SA, WA to lines which may connect to the respective bit lines BL0, BL1, BL2, BL3 by respective switching transistors ST2, ST3, SR4, ST5. For example, to select the memory cell MEM1, word line WL0 is selected, the switch ST1 is closed, the switch ST3 is closed, and the switches ST2, ST4, ST5 are open, so that bit line BL1 is selected. In programming the memory device RM0 of memory cell MEM1, a voltage is applied to the bit line BL1 through the switch ST1 and switch ST3, and the source S0 of the transistor TR0 is grounded, i.e. common source CS is connected to ground. A relatively large current then passes through the memory device MEM1 and the diode DI1 (forward biased in the direction of such current) to the drain D0 of the transistor TR0 and to the grounded source S0 thereof.

In this high-current programming situation, the large transistor TR0 provides high current drivability so as to achieve proper and rapid programming of the memory device. This large transistor TR0, operatively connected to other cells in the group, provides the same advantage for any of the memory cells of that group.

The diodes of the unselected memory cells insure that current flowing in the common line CL (from the selected memory cell MEM1) cannot flow back through other resistive memory devices, which current, if it were allowed to flow, could undesirably alter the state of such memory devices.

Figure 37:
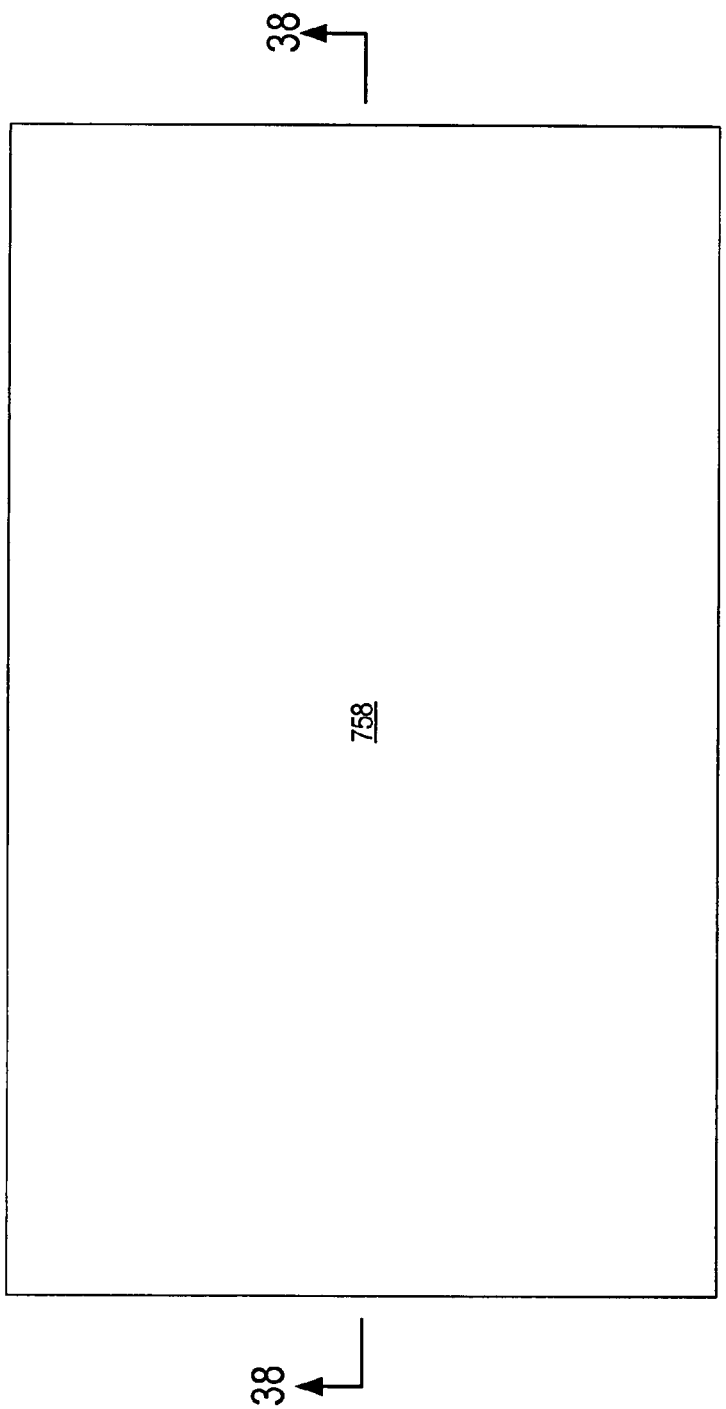
Figure 38:
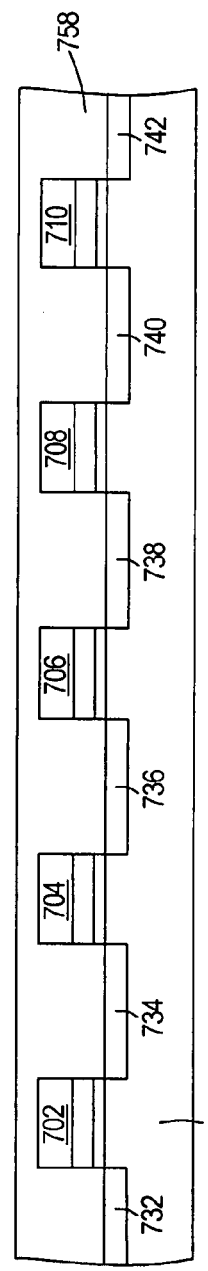
Figure 39:
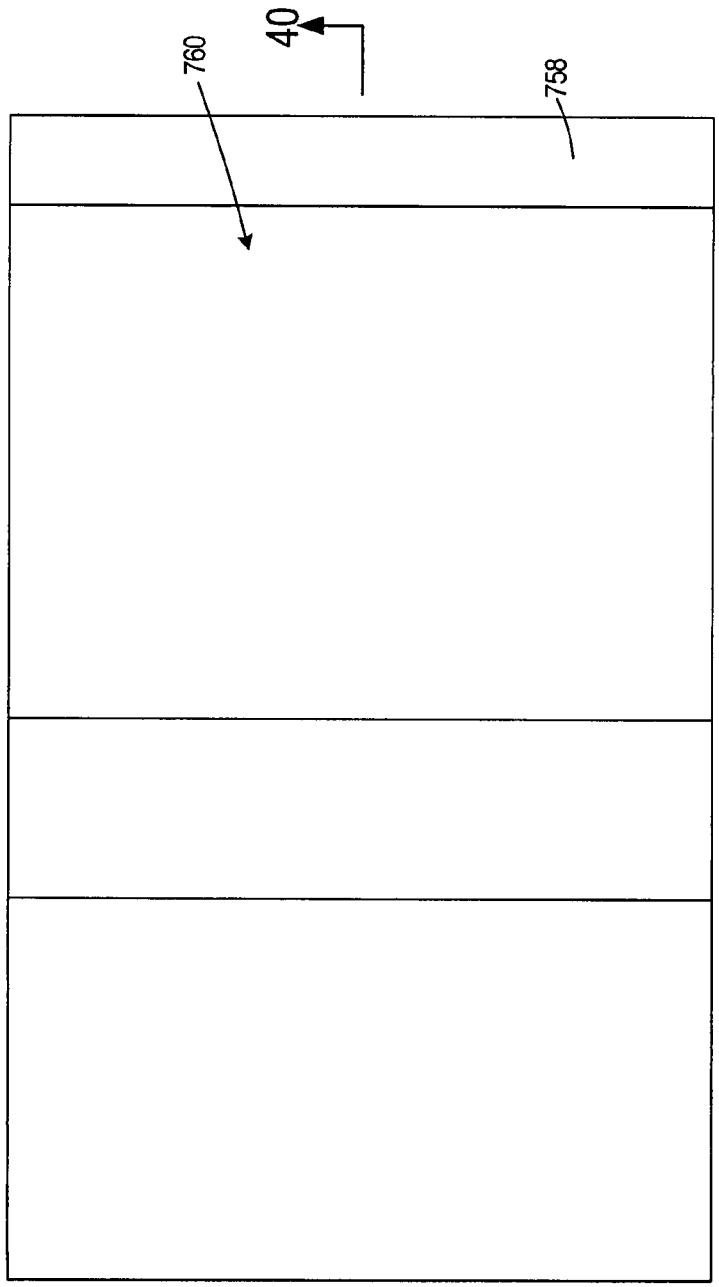
Figure 40:
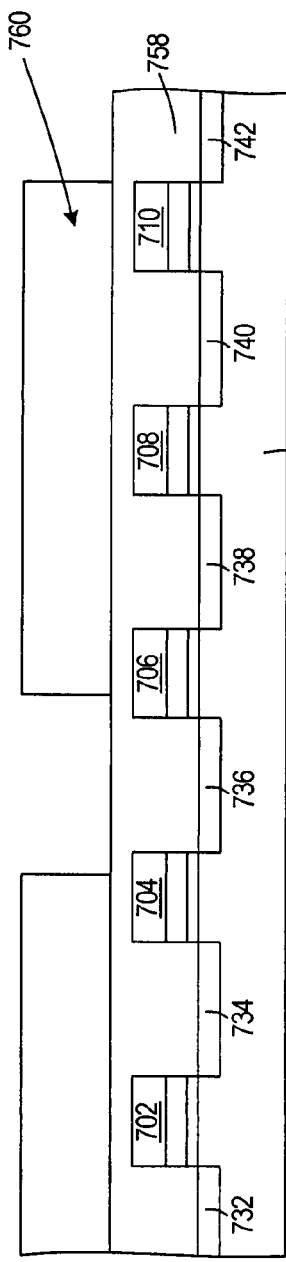
Figure 41:
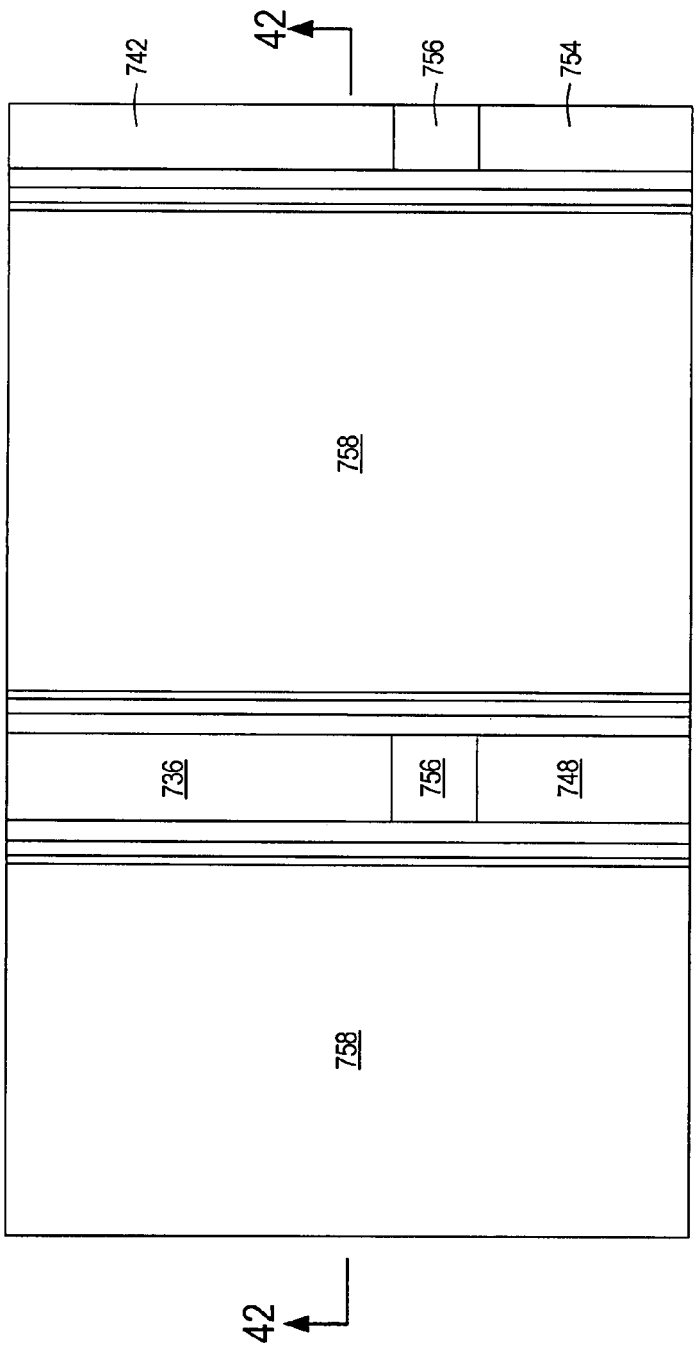
Figure 42:
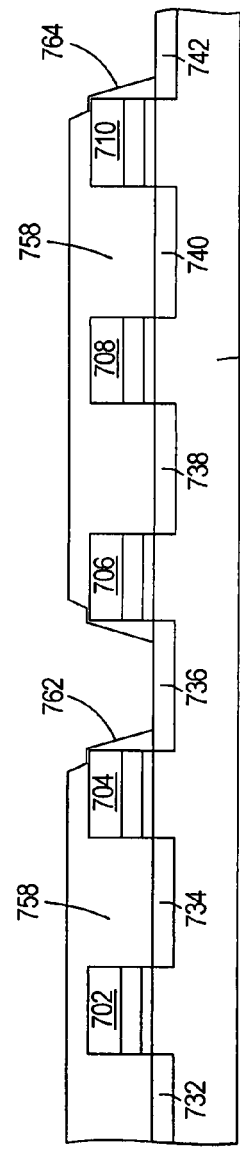
Figure 43:
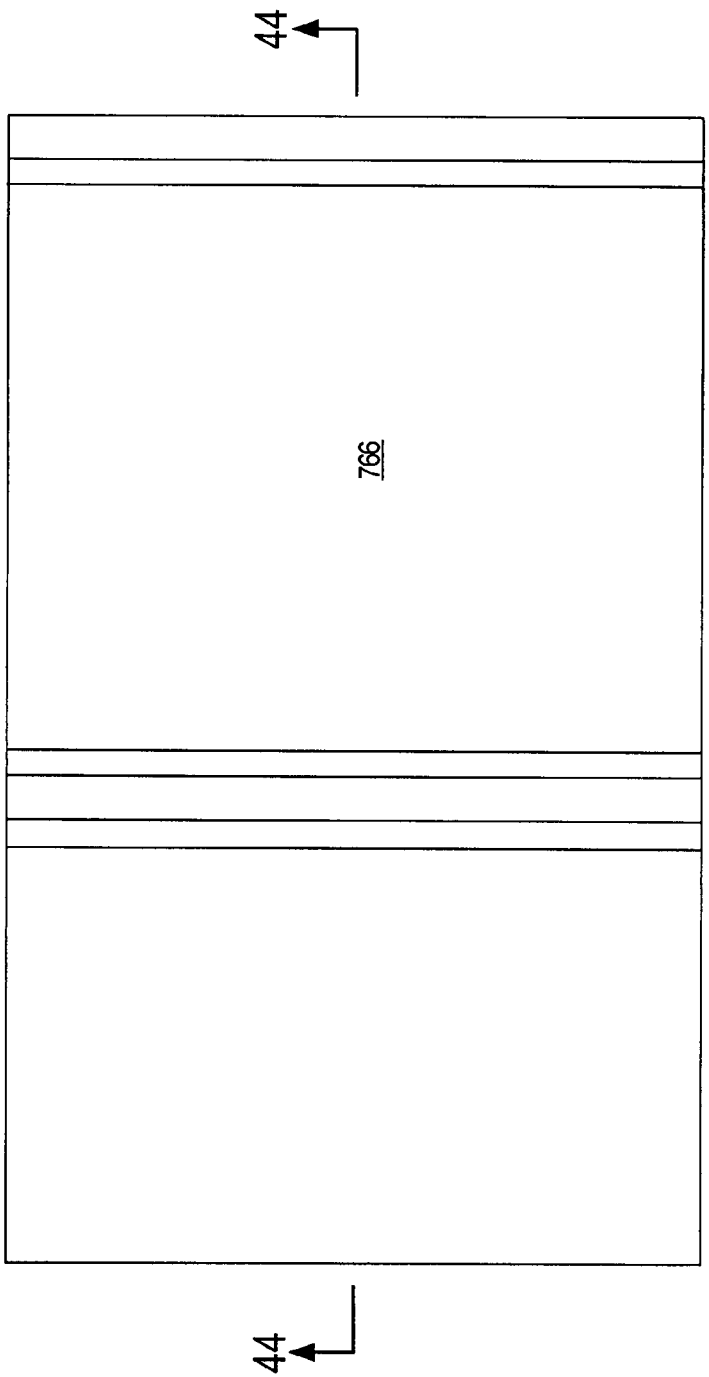
Figure 44:
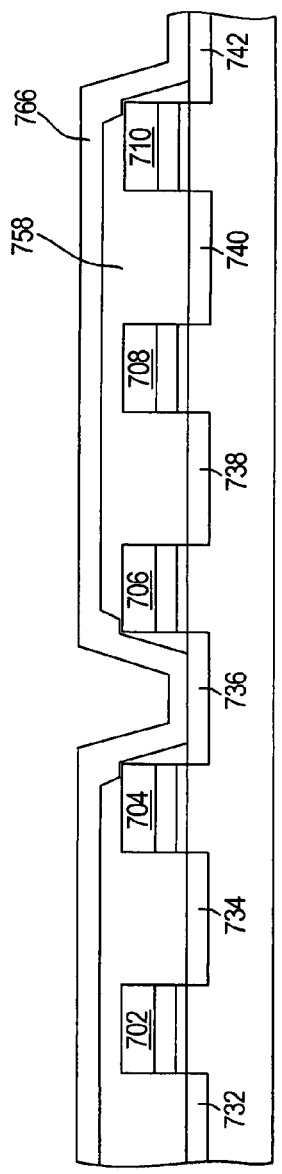
Figure 47:
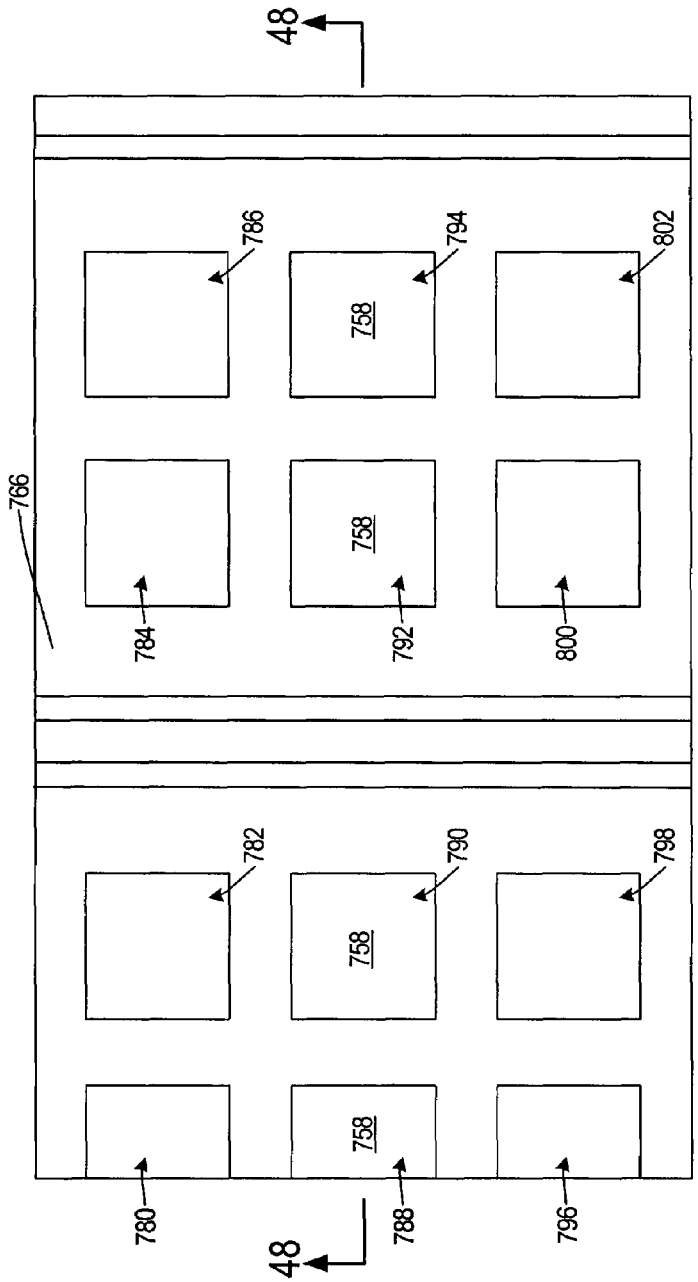
Figure 48:
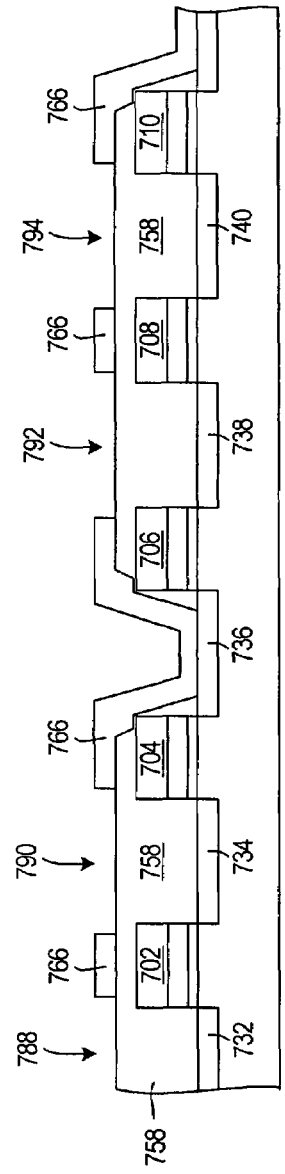

Fabrication of the array 700 of FIG. 34 is illustrated in FIGS. 35-55. Initially, and with reference to FIGS. 35 and 36, a p type silicon semiconductor substrate 701 is provided, and through the use of well-known techniques using silicon nitride masking (702, 704, 706, 708, 710), spaced gate oxide strips 712, 714, 716, 718, 720, and metal strips 722, 724, 726, 728, 730 are provided, and a plurality of isolated n+ diffused regions 732-754 are provided in the substrate 701, the n+ diffused regions 732-742 being separated from the n+ diffused regions 744-754 by silicon trench isolation region 756. Next, with reference to FIGS. 37 and 38, a silicon nitride layer 758 is provided over the resulting structure, and is planarized to provide a substantially flat upper surface. A layer of photoresist 760 is provided over the nitride layer 758, and the photoresist layer 760 is patterned as shown (FIGS. 39 and 40). Using the remaining photoresist as a mask, the nitride layer 758 is etched to provide elongated openings 762, 764 therethrough, the opening 762 exposing the n+ regions 736, 748, the opening 764 exposing the n+ regions 742, 754 (FIGS. 41 and 42). After removal of the photoresist 760, a metal layer 766, for example, tungsten, is provided over the resulting structure, the metal layer 766 contacting and connecting the n+ regions 736, 748, 742, 754 (FIGS. 43 and 44). A layer of photoresist 768 is provided over the metal layer 766, and the photoresist layer 768 is patterned as shown (FIGS. 45 and 46). Using the remaining photoresist as a mask, the metal layer 766 is etched to provide openings 780-802 therethrough to the nitride layer 758 (FIGS. 47 and 48), patterning the metal layer 766 while retaining the plate-like configuration of the metal layer 766.

Figure 51:
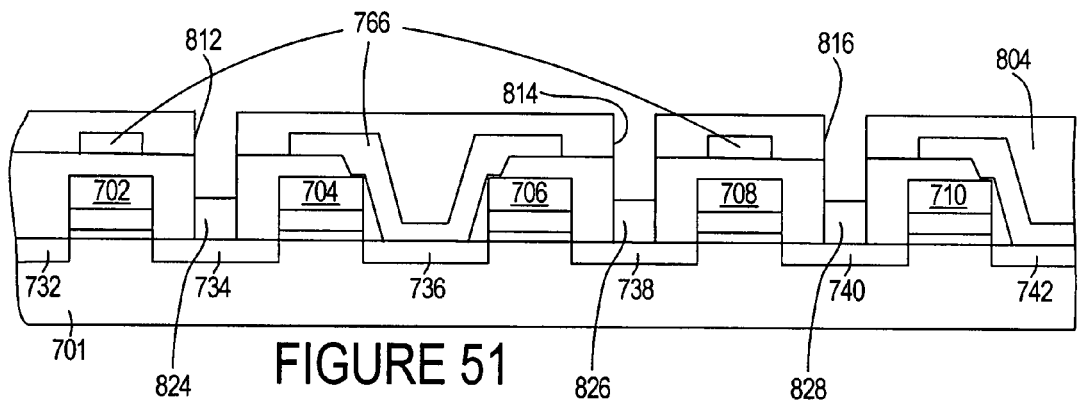
Figure 52:
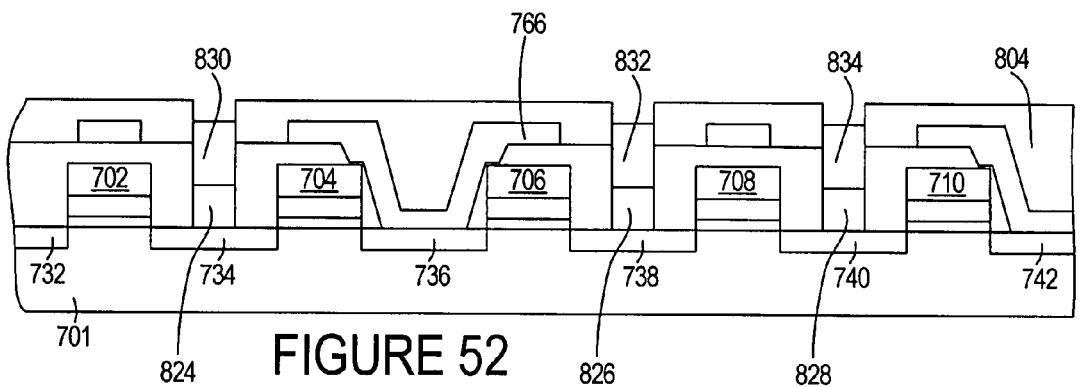
Figure 53:
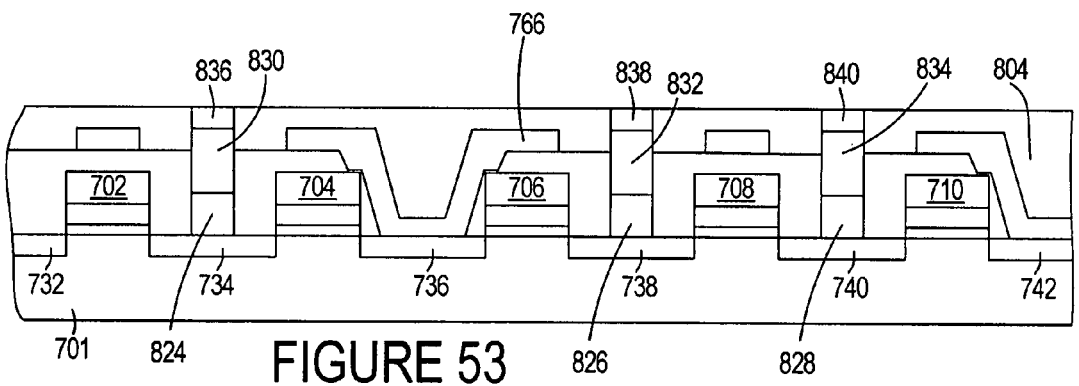

With reference to FIGS. 49 and 50, another silicon nitride layer 804 is provided over the resulting structure, and using appropriate photoresist masking techniques, openings 806-822 are etched through the nitride layer 804 and the nitride layer 758 to the n+ regions in the substrate 701 (openings 812, 814, 816 shown in FIG. 50, which will serve as an example for all openings 806-822 and processes related thereto). P type silicon regions 824, 826, 828 are grown in the openings 812, 814, 816 on the respective n+ regions 734, 738, 740 of the substrate 701 (FIG. 51). Tungsten plugs 830, 832, 834 are formed in the respective openings 812, 814, 816 on and in contact with the p type silicon regions 824, 826, 828 respectively, and copper bodies 836, 838, 840 are provided in the openings 812, 814, 816 on and in contact with the respective tungsten plugs 830, 832, 834 (FIGS. 52 and 53). An oxidation process is undertaken to form copper oxide 842, 844, 846 on the respective copper bodies 836, 838, 840, and copper bit line 850, one of a plurality of copper bit lines 848, 850, 852 formed over the structure as previously described, contacts the exposed copper oxide 842, 844, 846, FIGS. 54 and 55 (metal strips 724, 726, 728 are the word lines, as previously shown and described).

In this embodiment, consistent with FIG. 34, each memory device-diode structure is made up of an n+ region and a p type silicon region in contact therewith (the diode), and a copper body, copper oxide portion, and copper bit line (the memory device), the tungsten plug connecting the diode and memory device in series.

The n+ regions 736, 748, 742, 754 are source regions, commonly connected by the plate-like metal conductor 766 which, has portions in contact with these source regions, and other portions spaced from the substrate 701 and connected to the portions in contact with the source regions. As will be seen, the plate-like conductor 766 forms with the source regions 736, 748, 742, 754 a common source. The plate-like conductor 766, as shown and described above, defines openings 780-802 through the portions thereof spaced from the substrate 701, wherein the resistive memory devices communicate with the substrate 701 through the respective openings in the plate-like conductor 766. Similar to the previous embodiments, isolation regions (such as isolation region 756) are provided between adjacent pluralities of source regions.

Using the masking technology as described above, it will be seen that the contacts to the substrate 701 are self-aligned to the respective n+ source regions, using silicon nitride as a mask, so that proper placement of these contacts is achieved in an efficient manner.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory array comprising;
    a plurality of word lines;
    a plurality of bit lines each of which are coupled to a plurality of switches;
    a plurality of common source lines;
    a plurality of transistors comprising first and second terminals and a gate, wherein each word line of the plurality of word lines is connected to respective gates of first and second transistors of the plurality of transistors and wherein each common source line of the plurality of common source lines is coupled to respective first and second transistors of the plurality of transistors;
    a first structure interconnecting a first bit line with a first terminal of a third transistor of the plurality of transistors, the first structure comprising a resistive memory device wherein the third transistor is coupled between the first and the second transistors; and
    a second structure interconnecting the first bit line with a second terminal of the third transistor, the second structure comprising a resistive memory device.

2. The memory array of claim 1 wherein the first structure further comprises a diode in series with the resistive memory device, and the second structure comprises a diode in series with the resistive memory device.

3. The memory array of claim 2 wherein the first terminal is a drain, and the second terminal is a source.

4. The memory array of claim 2 wherein the diode of the first structure is oriented in the forward direction from the first bit line to the drain of the transistor, and wherein the diode of the second structure is oriented in the forward direction from the second bit line to the drain of the transistor.

5. The memory array of claim 4 wherein each resistive memory device comprises first and second spaced electrodes, and an active region between and in contact with the first and second electrodes.

\* \* \* \* \*